United States Patent [19]
Abele et al.

[11] Patent Number: 5,495,222
[45] Date of Patent: Feb. 27, 1996

[54] OPEN PERMANENT MAGNET STRUCTURE FOR GENERATING HIGHLY UNIFORM FIELD

[75] Inventors: Manlio G. Abele, New York; Henry Rusinek, Great Neck; Jens Jensen, Harrison, all of N.Y.

[73] Assignee: New York University, New York, N.Y.

[21] Appl. No.: 406,340

[22] Filed: Mar. 13, 1995

Related U.S. Application Data

[63] Continuation-in-part of Ser. No. 228,291, Apr. 15, 1994.

[51] Int. Cl.$^6$ ........................................................ H01F 7/02
[52] U.S. Cl. .................................................................. 335/306
[58] Field of Search ...................................... 335/301–306; 324/318, 319, 320; 128/653.5

[56] References Cited

U.S. PATENT DOCUMENTS 5,049,848  9/1991  Pulyer ........................................ 335/296

OTHER PUBLICATIONS

Manlio G. Abele, Structures of Permanent Magnets, John Wiley and Sons, New York, pp. 177–180 and 223–227, 1993.
Jensen JH, Abele, M. G., Effects of field orientation on field uniformity in permament magnet structures, J. Appl. Phys. 76(10), 6853–6855, 1994.
Manlio, G. Abele, Henry Rusinek, Field computation in permanent magnets with linear characteristics of magnetic media and ferromagnetic materials. Technical Report 24, New York University, pp. 1–21, Aug. 15, 1991.
Abele, M. G., Generation of highly uniform fields with permanent magnets. Technical Report No. 26, Department of Radiology, New York University School of Medicine, pp. 1–19, Jun. 15, 1994.
Abele, M. G., Generation of highy uniform fields with permanent magnets, (invited paper). J. Appl. Phys. 76(10), 6247–6252, 1994.
Abele, M. G., Jensen, J., Rusinek, H., Linear Theory of Pole Piece Design in Permanent Magnets. Proceedings of XIII International Workshop on Rare–Earth Magnets and Applications. CAF Manwaring, DGR Jones, AJ Williams and IR Harris, Eds, University of Brimingham, Edgbaston, United Kingdom, pp. 167–176, 1994.
P. B. Roemer, J. F. Schenck, F. A. Jolesz, E. T. Laskaris, R. W. Newman, S. M. Blumenfeld, K. G. Vosburgh, "A System for MRI–guided interventional procedures," Proceedings of IInd meeting; Society of Magnetic Resonance, vol. 1., p. 420.

*Primary Examiner*—Leo P. Picard
*Assistant Examiner*—Raymond M. Barrera

[57] ABSTRACT

A hybrid permanent magnet structure for providing a uniform magnetic field within a region of interest while allowing access via open ends by a patient for NMR scanning and by a surgeon to the patient via a large opening at the top. The magnet structure comprises nested inner and outer magnetic structures separated by ferromagnetic material and surrounded by a ferromagnetic yoke. The inner magnetic sections comprise end blocks of triangular cross-section, and the outer magnetic sections comprise end blocks of trapezoidal cross-section. Field distortion compensating means is provided by a primary filter structure to the ferromagnetic material and by magnetic insertions or a secondary filter structure.

18 Claims, 24 Drawing Sheets

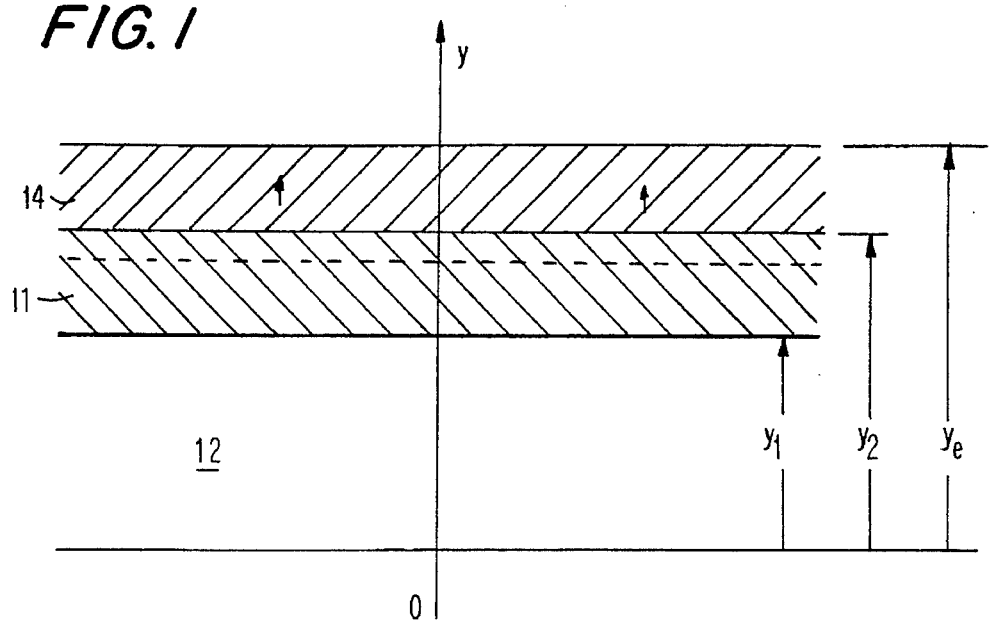
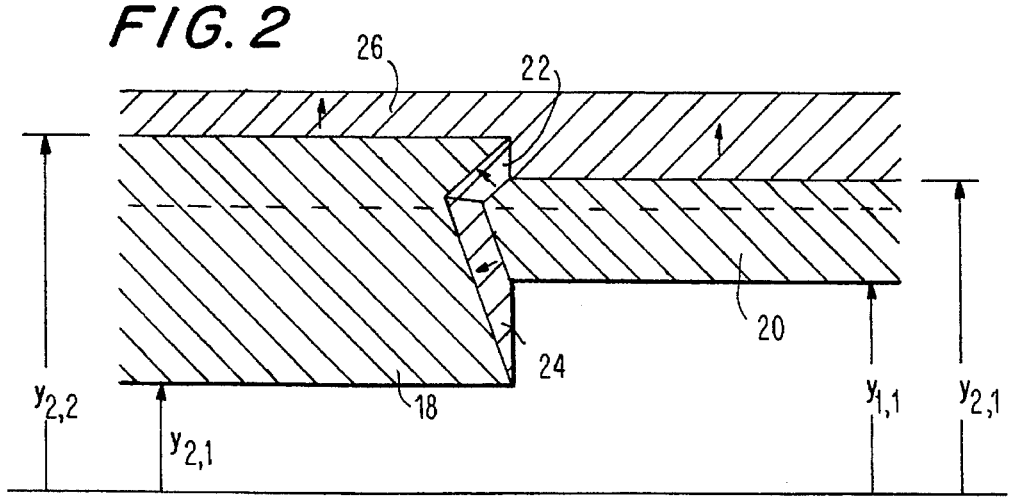

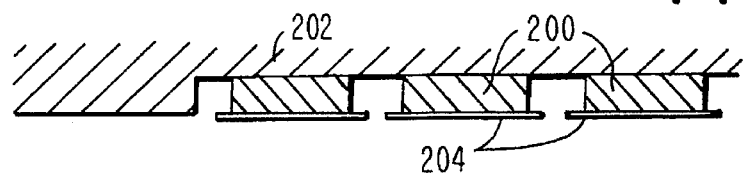
FIG.30
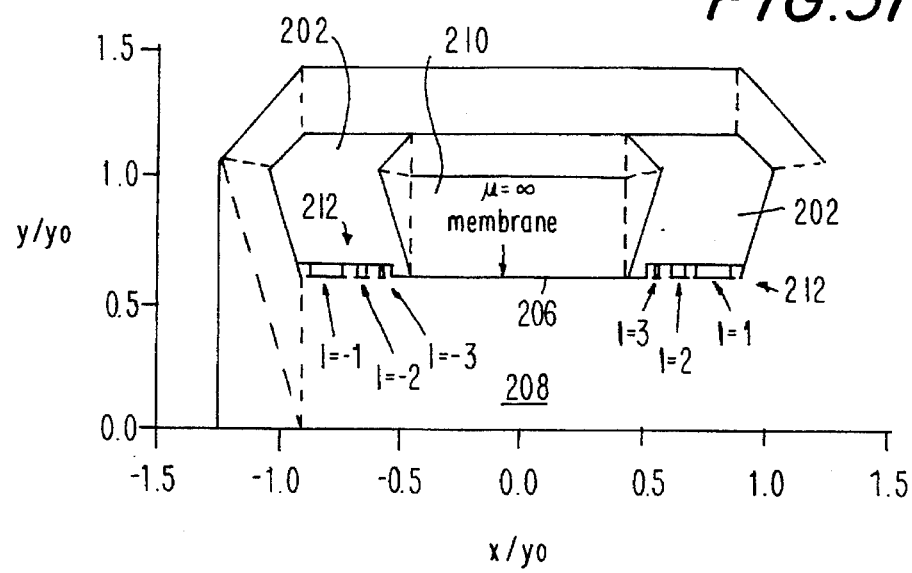
FIG.31
FIG.32
| n | $a_n$ (before) | $a_n$ (after) | $b_n$ (before) | $b_n$ (after) |
|---|---|---|---|---|
| 1 | $1.3 \times 10^{-4}$ | 0 | $1.8 \times 10^{-4}$ | 0 |
| 2 | $-5.8 \times 10^{-7}$ | 0 | $-5.1 \times 10^{-7}$ | 0 |
| 3 | $1.3 \times 10^{-8}$ | 0 | $2.7 \times 10^{-9}$ | 0 |
| 4 | $-6.3 \times 10^{-10}$ | $2.2 \times 10^{-9}$ | $-3.4 \times 10^{-11}$ | $3.3 \times 10^{-9}$ |
| 5 | $3.6 \times 10^{-11}$ | $-2.3 \times 10^{-10}$ | $1.3 \times 10^{-12}$ | $-3.5 \times 10^{-10}$ |

OPEN PERMANENT MAGNET STRUCTURE FOR GENERATING HIGHLY UNIFORM FIELD

RELATED APPLICATION

This application is a continuation-in-part of U.S. application, Ser. No. 08/228,291, filed Apr. 15, 1994, in the names of the same inventors (NYU-147).

BACKGROUND OF INVENTION

This invention relates to permanent magnet structures for generating very strong yet highly uniform magnetic fields, primarily but not exclusively for use in medical applications of nuclear magnetic resonance.

Medical applications of nuclear magnetic resonance (NMR) are primarily based on the use of either superconductive magnets or permanent magnets to generate the highly uniform field required for imaging. The main advantage of superconductive magnets is their ability to reach high magnetic fields. The superconductive coils that carry the electric current are normally arranged in cylindrical structures open at both ends, and the patient is inserted axially to access the imaging region located at the center of the magnet. This arrangement, dictated by the geometry of the coils, generates a number of problems in clinical as well as surgical applications. For instance, real time imaging during a surgical procedure is hampered by the interference of the magnet structure with the surgical instrumentation and by the restricted access to the patient and to the surgical area in particular.

To alleviate these problems, in recent designs based on superconductive magnets as described in "A System for MRI-guided interventional procedures" P. B. Reemer, J. F. Schenck, F. A. Jolesz et al. Proceedings of $II^{nd}$ meeting; Society at Magnetic Resonance, Vol. 1., p. 420, the surgical area is positioned outside the superconductive coils. These approaches require the coil dimensions to be large compared to the body dimensions in order to achieve the desired degree of field uniformity within the surgical area. Furthermore, a field much larger than the one required within the imaging region is generated outside the region of interest and outside the magnet itself.

The use of permanent magnets that require no external power supply and no maintenance is gaining momentum in medical imaging, in spite of their limitations in the generation of high fields. Traditional permanent magnets can be designed with yoke geometries that leave a wide open area around the imaging region contained within the gap between the pole pieces. However, to keep the magnet size and its weight within practical limits, the pole pieces must be as close as possible to the body. The large transverse dimensions of the pole pieces dictated by the required field uniformity within the region of interest again limits the access to the patient and interferes with the surgical instrumentation. Moreover, as the field within the region of interest increases, the efficiency of a traditional permanent magnet decreases, with an increasing level of the stray field outside the gap.

SUMMARY OF INVENTION

An object of the invention is an open-ended magnetic structure providing a highly-uniform magnetic field in an imaging region in a main cavity within the structure and allowing access to the main cavity via a large opening along one side of the structure.

A further object of the invention is a permanent magnetic structure for accommodating in a main cavity a patient for NMR imaging while simultaneously allowing a surgeon to conduct a surgical procedure on the patient.

In accordance with a first aspect of the invention, a magnetic structure is provided having a generally cylindrical configuration with a generally cylindrical main cavity large enough to accommodate the body of a patient lying on his or her back. A large opening is provided in a top wall of the structure, with the opening large enough to allow a surgeon or other medical practitioner to reach through the top opening to access the body of a patient in the cavity. The magnetic structure provides inside a region of interest or imaging region of the cavity a very strong, highly-uniform magnetic field generated by permanent magnets and capable of supporting NMR imaging.

In accordance with a further aspect of the invention, the magnetic structure has a generally C-shaped cross-section lying on its side with opposed upright side walls. The magnetic structure comprises along the side walls permanent magnet blocks oriented to provide a vertical field within the cavity, an inner lining of soft ferromagnetic material, and an outer yoke of soft ferromagnetic material completely surrounding the permanent magnet blocks and providing a return path for flux.

In accordance with still a further aspect of the invention, means are provided on the magnetic structure for compensating for field distortions due to the open ends for accommodating the patient, but mainly due to the discontinuities resulting from the opening of the top wall for access by the medical practitioner to the patient. In accordance with a preferred embodiment of this aspect of the invention, an outer primary magnetic structure comprises a first permanent magnet structure and ferromagnetic pole pieces defining a first central open-ended cavity also providing a side access opening, the first permanent magnet structure generating a substantially uniform magnetic field within an imaging region of the central cavity. Nested within the ferromagnetic pole pieces is an inner secondary magnetic structure defining respective lateral cavities adjoining both sides of the central cavity and in which is generated the same substantially uniform magnetic field as is generated in the central cavity. The provision of the central cavity accessible via the side opening produces field distortions that must be compensated to provide the substantially uniform magnetic field in the region of interest to support, for example, NMR imaging. The secondary magnetic structure by providing substantially the same uniform field in the lateral cavities—at whose interface with the central cavity field singularities would arise in the absence of the secondary magnetic structure—supports the correction of the field distortion without which NMR imaging would not be possible.

The combination of the central cavity with the adjoining lateral cavities provides an enlarged imaging region with a uniform magnetic field to support NMR imaging without increasing the overall size of the magnetic structure and with an actual reduction in the overall weight of the magnetic material needed.

In a further preferred embodiment, field distortion compensation means is provided by a unique arrangement of permanent magnetic and soft magnetic blocks, and by a filter structure to compensate for a number of spatial harmonics of the field distortion.

The magnetic structure of the invention is particularly suitable for medical applications since the imaging region extends over a large portion of the main cavity. As a consequence, the magnetic structure can be used in a compact clinical scanner designed for whole body imaging. Moreover, the use of modern, high energy product, rare earth materials results in a magnetic structure capable of generating fields up to 0.5 T within practical weight and size limits. The remarkable proximity of the region of high field uniformity to the side opening of the magnet makes this structure of interest for surgical/interventional applications. The compact magnetic structure with a large opening makes it possible to integrate the gantry of a scanner in a surgical suite with minimum interference with surgical procedures.

These and other objects and attainments together with a fuller understanding of the invention will become apparent and appreciated by referring to the following descriptions and claims taken in conjunction with the accompanying drawings which illustrate by way of example and not limitation preferred embodiments of the invention and wherein like reference numerals denote like or corresponding parts.

SUMMARY OF DRAWINGS

In the drawings:

FIG. 1 is a schematic configuration of a permanent magnetic (light shading) and soft ferromagnetic (denser shading) layer that generates a uniform field within an air gap;

FIG. 2 shows in a structure as in FIG. 1 how in accordance with the invention a transition between two regions of different thickness, each generating the same field in the air gap region, can be accomplished using two trapezoidal permanent magnetic components;

FIG. 30 is an enlarged cross-sectional view of typical filter elements;

FIG. 31 is a view similar to FIG. 10 explaining the development of a preferred field distortion compensation method;

FIG. 32 is a table of expansion coefficients before and after adjustment of the filter structure;

DETAILED DESCRIPTION OF PREFERRED EMBODIMENTS

Figure 3:
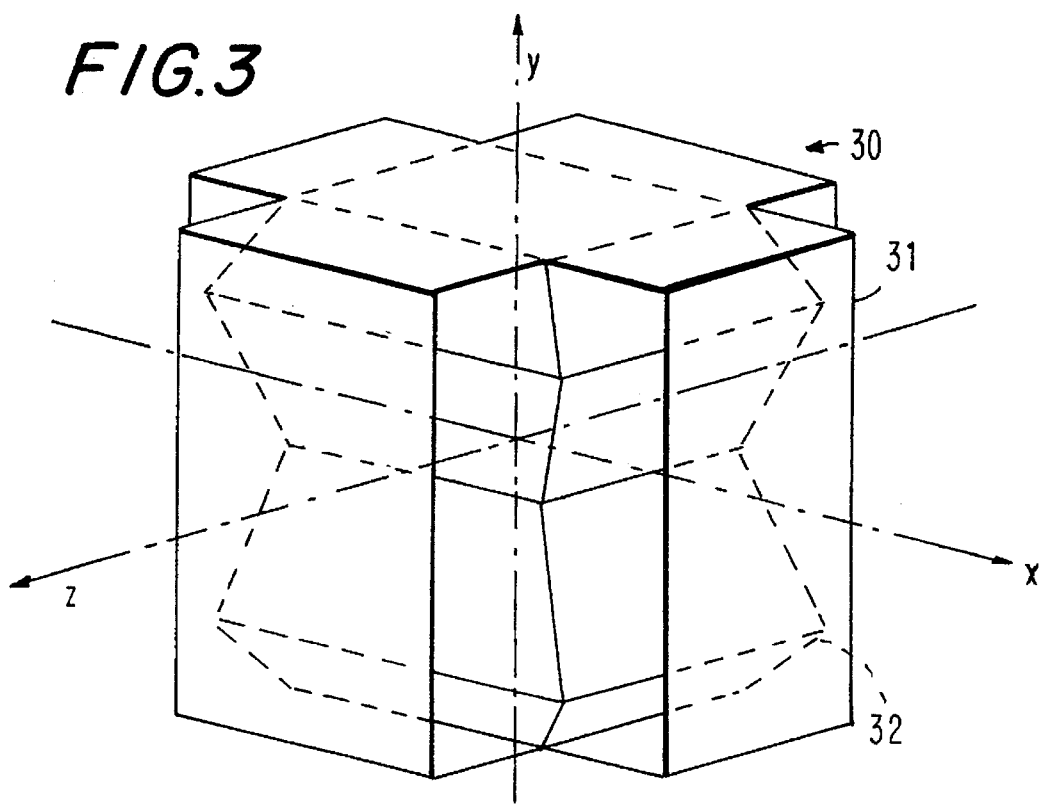
FIG. 3 is a perspective view of a three-dimensional hybrid magnet with rectangular prismatic cavity and magnetic field aligned with the y axis; the magnet in this figure has a closed cavity and an external yoke.

The invention will be better understood from a description of the principles applied in developing an embodiment of the magnetic structure of the invention.

Briefly summarizing, we take advantage of the fact that (a) efficient permanent magnets can be designed with a new design methodology based on the use of modern magnetic materials with quasilinear demagnetization characteristics [1], (b) the development of rare earth, high energy product alloys makes it possible to extend the application of permanent magnets technology to large and powerful magnets, and (c) exact mathematical procedures can be followed in the design of open magnetic structures that optimize the efficiency of a magnet by minimizing its size and weight.

We describe below a magnetic structure designed according to the new methodology. Access to the patient is provided through a large opening along one side of the magnet, in addition to the two open ends of the structure. Although the dimensions of the magnet presented in this paper are specifically intended for clinical interventions and surgery, a similar type of open structure can be used for other clinical applications that require a wide opening providing access to the region of interest with a minimum stray field.

1. Basic Geometry of the Magnet

Consider the schematic of FIG. 1, where the two surfaces $y=0$ and $y=y_e$ are equipotential surfaces at zero potential. The medium in the two regions $y<0$ and $y>y_c$ is assumed to be an ideal ferromagnetic medium of infinite magnetic permeability. Assume that an infinite magnetic permeability plate 11 of thickness $y_2-y_1$ is inserted in the region $y<y_e$. The medium 12 in the region $y<y_1$ is assumed to be air, and the medium in the region 14 $y_2<y<y_e$ is assumed to be an ideal magnetic medium whose magnetic characteristic is $$\vec{B} = \vec{J} + \mu_0 \vec{H}_0 \tag{1.1}$$

where $\vec{B}$ is the magnetic induction, $\vec{J}$ is the remanence, $\vec{H}_0$ is the intensity of the magnetic field which is aligned with the y axis, and $\mu_0$ is the magnetic permeability of a vacuum. The remanence $\vec{J}$ is assumed to be oriented parallel to the axis y. The intensity $\vec{H}_0$ of the field within the region 12 $y<y_1$ is given by [1]

$$\mu_0 H_0 = KJ, \tag{1.2}$$

where $$K = \frac{y_e - y_2}{y_e - (y_2 - y_1)} \tag{1.3}$$

As long as Eq. (1.3) is satisfied for a given K, the same value of the field $\vec{H}_0$ in the air gap 12 can be achieved for a range of dimensions $y_1, y_2$. A limiting case occurs when $y_1 \to 0$, $y_2 \to y_e$, in which case the entire region becomes the ferromagnetic medium. A second limiting case occurs when the thickness $y_2 - y_1$ of the ferromagnetic medium 11 is reduced to zero, forming a direct interface between the magnetic medium 14 and air, as indicated by the dashed line in FIG. 1.

An important objective of permanent magnet design is the design of a transition between two regions of different heights $y_{1,1}, y_{1,2}$ of the air gap and different thicknesses $y_{2,1} - y_{1,1}$ and $y_{2,2} - y_{1,2}$ of the ferromagnetic plates and generating the same field in the air gap. As long as the two region satisfy the condition $$\frac{y_e - y_{2,1}}{y_e - (y_{2,1} - y_{1,1})} = \frac{y_e - y_{2,2}}{y_e - (y_{2,2} - y_{1,2})} = K \tag{1.4}$$

such a transition can be accomplished without distorting the uniformity of the field by means of the technique illustrated in FIG. 2. The two plates 18, 20 are separated from each other by two trapezoidal components 22, 24 of permanent magnetic material. The angles $\alpha, \beta$ of the interfaces between the trapezoidal components 22, 24 and the $\mu=\infty$ plates 18, 20 are given by $$\tan \alpha = \frac{K}{\sqrt{1-K^2}}, \tan \beta = \frac{1-K}{\sqrt{1-(1-K)^2}} \tag{1.5}$$

The remanences of the trapezoidal components 22, 24 have the same magnitude of $\vec{J}$ as the remanence in the magnetic layers 26 shown in FIG. 2 and are oriented perpendicular to their interfaces with the $\mu=\infty$ plates 18, 20. By virtue of Eq. (1.5), the intensities of the magnetic field in the two trapezoidal components 18, 20 are equal and opposite to their remanences and, as a consequence, in both components one has $$\vec{B} = 0; \tag{1.6}$$

i.e., no flux of $\vec{B}$ is generated in the trapezoidal components. The structure of FIG. 2 provides the basic design approach for the open magnet presented in this application. For a more complete description of the function and operation of the two trapezoidal components, reference is had to U.S. Pat. No. 5,162,771, whose contents are incorporated herein by reference.

Figure 4:
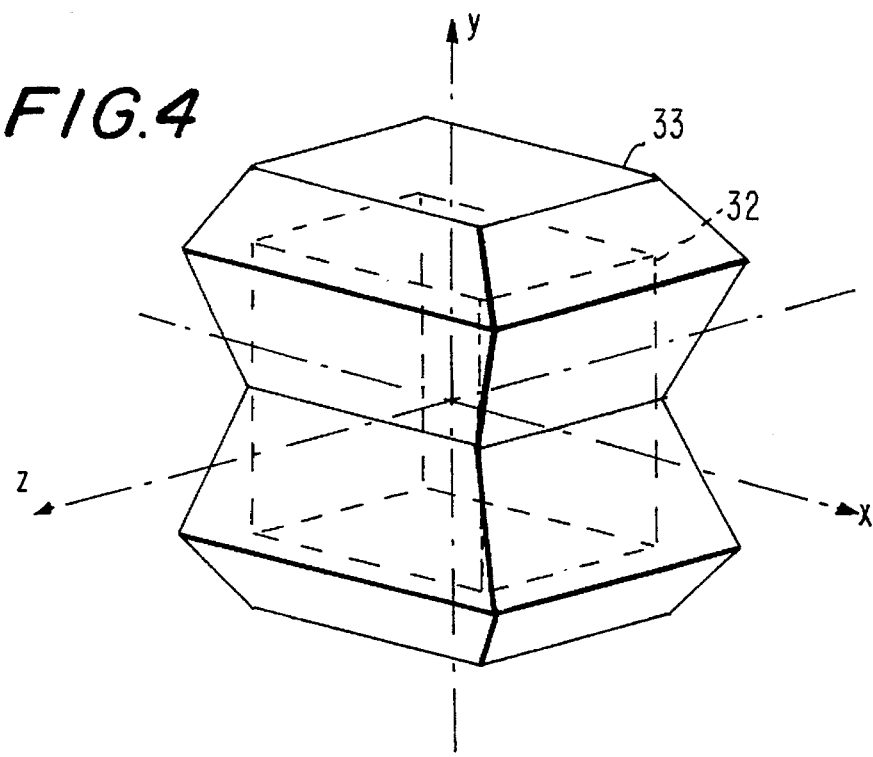
FIG. 4 is a view similar to that of FIG. 3 of a detailed view of a closed three-dimensional hybrid magnet.

The open magnet evolves from a hybrid three-dimensional magnet 30 with rectangular prismatic cavity 32 shown in FIG. 3, designed to generate in the prismatic cavity a uniform field of intensity $\vec{H}_0$ aligned with the y axis. The outer components referenced 31 indicate an external yoke that encloses the structure. The characteristics of hybrid magnets have been discussed in detail previously [1]. (The bracketed numbers reference in an Appendix the identification of published papers.) The external surface of the magnet 33 is enclosed by an ideal yoke 31 of infinite permeability $\mu$. The entire three-dimensional magnetic structure 33 is shown in FIG. 4 and its cross section in the first quadrant in the plane $z=0$ in FIG. 5.

The distribution of remanences $\vec{J}_1$, $\vec{J}_{12}$, $\vec{J}_{21}$ of magnitude $J_0$, is related to the magnitude of the intensity $\vec{H}_0$ by Eq. (1.2).

Figure 5:
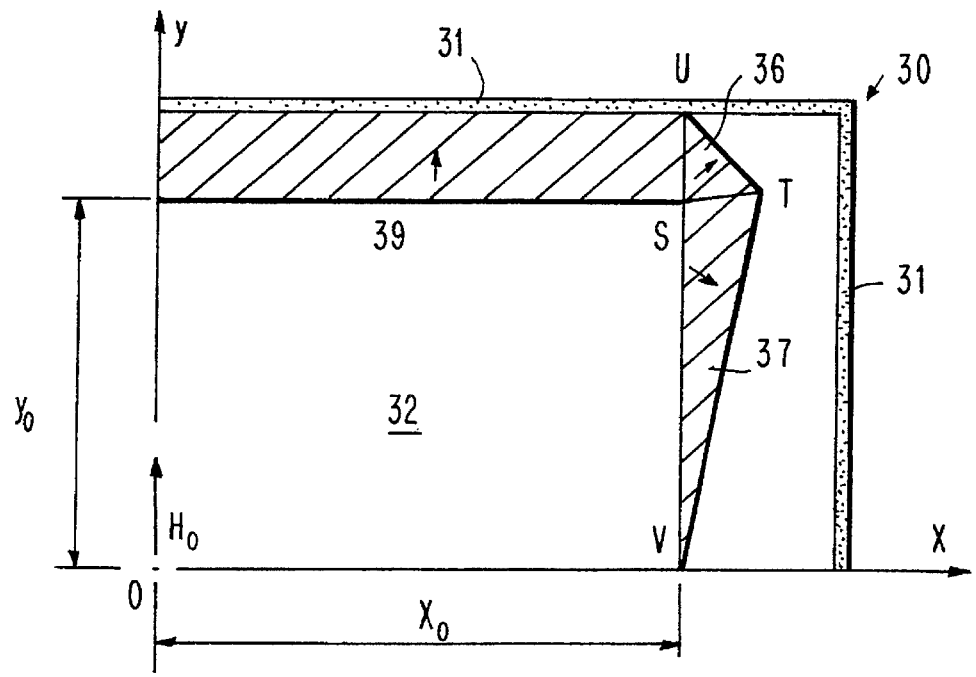
FIG. 5 is a schematic of a cross-section of a hybrid magnetic structure in the first quadrant in the plane z=0.

Vector $\vec{J}_1$ is oriented along the axis y and vectors $\vec{J}_{12}$, $\vec{J}_{21}$ are perpendicular to the external boundaries of two triangular permanent magnetic components 36 (S,T,U) and 37 (S,T,V) respectively, as indicated in FIG. 5. The geometry of the triangular components is such that the inductions $\vec{B}_{12}$ and $\vec{B}_{21}$ in both components are zero [1]. As a consequence, the flux of the induction in the cavity 32 is confined to the rectangular components of magnetic material of remanence $\vec{J}$. The ideal yoke that limits the rectangular components may be closed outside the interval UTV, following an arbitrary path, because the scalar potential $\Phi$ is zero in the region between the yoke 31 and the external surface of the triangular components 36, 37. The geometry of the ideal yoke 31 shown in FIG. 5 is selected for the design of the actual yoke structure presented herein.

Let $2x_0, 2y_0, 2z_0$ be the dimensions of the rectangular prismatic cavity 32. The coordinates $y_e, y_0$ of the points U,S are related by the equation $$\frac{y_e}{y_0} = \frac{1}{1-K} \quad (1.7)$$

and the coordinates of point T are $$\begin{cases} x_T = x_0 + y_0 \dfrac{K}{\sqrt{K_3(2-K)} + \sqrt{(1-K)^3(1+K)}} \\ y_T = y_0 \dfrac{\sqrt{(1-K^2)}}{\sqrt{K^3(2-K)} + \sqrt{(1-K)^3(1+K)}} \end{cases} \quad (1.8)$$

Figure 6:
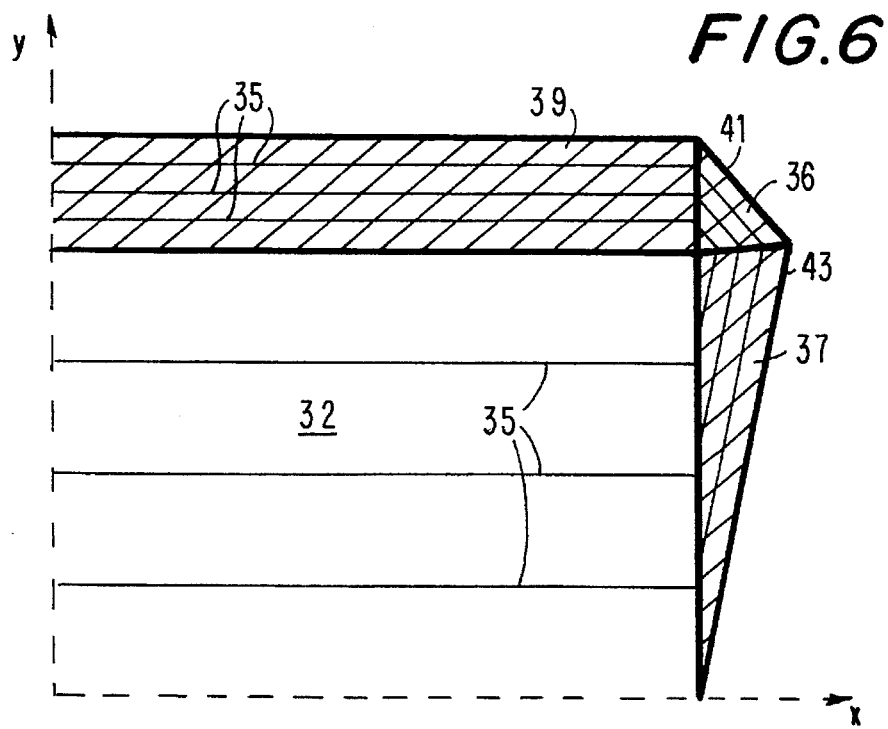
FIG. 6 shows the equipotential lines in the hybrid magnet of FIG. 5.

Let $\Phi_0$ be the potential of the interface between the cavity 32 and the rectangular components 39 of the magnetic material at $y=y_0$. The equipotential lines 35 in the first quadrant of the $z=0$ cross section are shown in FIG. 6. Each of FIGS. 6–10 have omitted, for simplicity, an external yoke for flux return path corresponding to item 31 shown as a thick line in FIG. 5.

Figure 7:
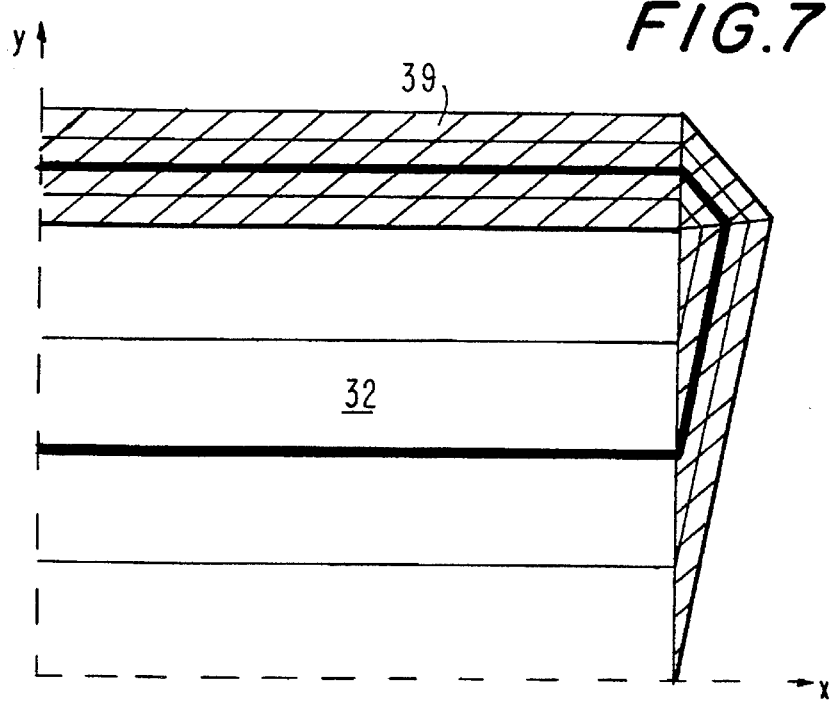
FIG. 7 illustrates the division of the hybrid magnet into two independent structures by transforming the equipotential surface $\Phi=\pm\Phi_1$ into $\mu=\infty$ surfaces.

Assume that the two equipotential surfaces 41, 43

$$\Phi = \pm\Phi_1 \quad (|\Phi_1| < |\Phi_0|) \quad (1.9)$$

are transformed into $\mu = \infty$ surfaces. The field configuration is not affected by this transformation and the resultant magnet cross-section in the $z=0$ plane is shown in FIG. 7, where the heavy line 38 defines the equipotential surface given by Eq. (1.9).

In FIG. 7 the original structure is divided into two independent magnetic structures 40, 41 by the lines $$y = \pm y_1 = \pm y_0 \frac{\Phi_1}{\Phi_0} \quad (1.10)$$

Because $(x_T - x_0)/y_0$ and $y_T/y_0$ are independent of the geometry of the magnet, the x dimension of the cavity 32 can be increased to $$2x_1 > 2x_0 \quad (1.11)$$

Figure 8:
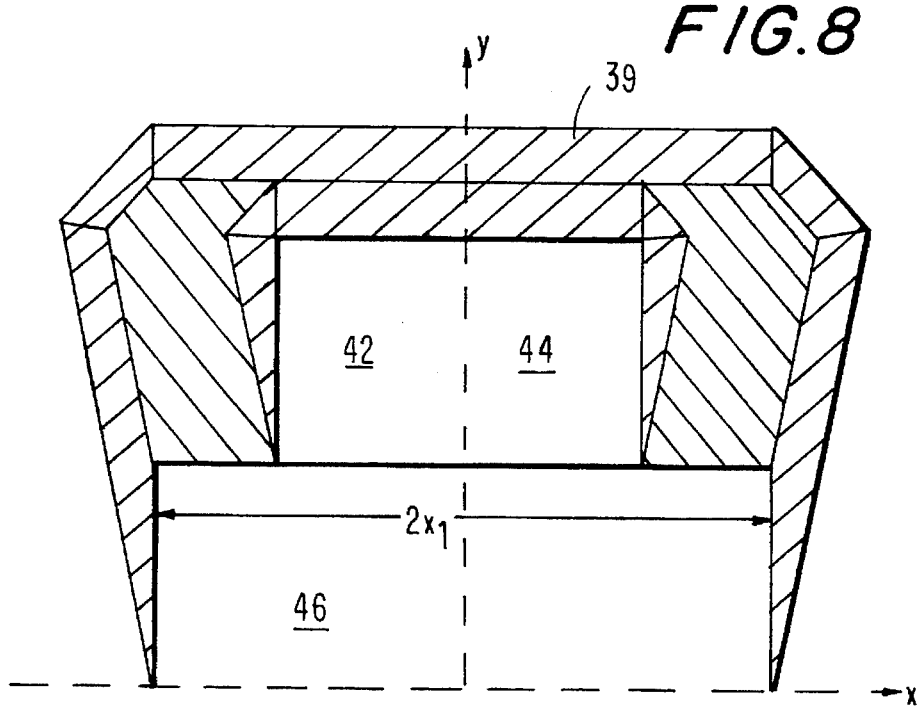
FIG. 8 shows a hybrid structure in accordance with the invention with the cavity extended in the x dimension and with ferromagnetic inserts added.

The extension of the cavity dimension in the x direction requires an equal extension of the rectangular components 39 of magnetic material in the region between the equipotential lines $\Phi = \pm\Phi_1$ and the external yoke. The resulting structure, restricted to the $y>0$ region, is shown in FIG. 8, where the closely-hatched areas are the cross-section of $\mu = \infty$ ferromagnetic material pole pieces 35. FIG. 8 shows what will hereafter be referred to from time to time as part of a central cavity 46 separated by a hypothetical membrane 43 from adjoining lateral cavities 42, 44.

Figure 9:
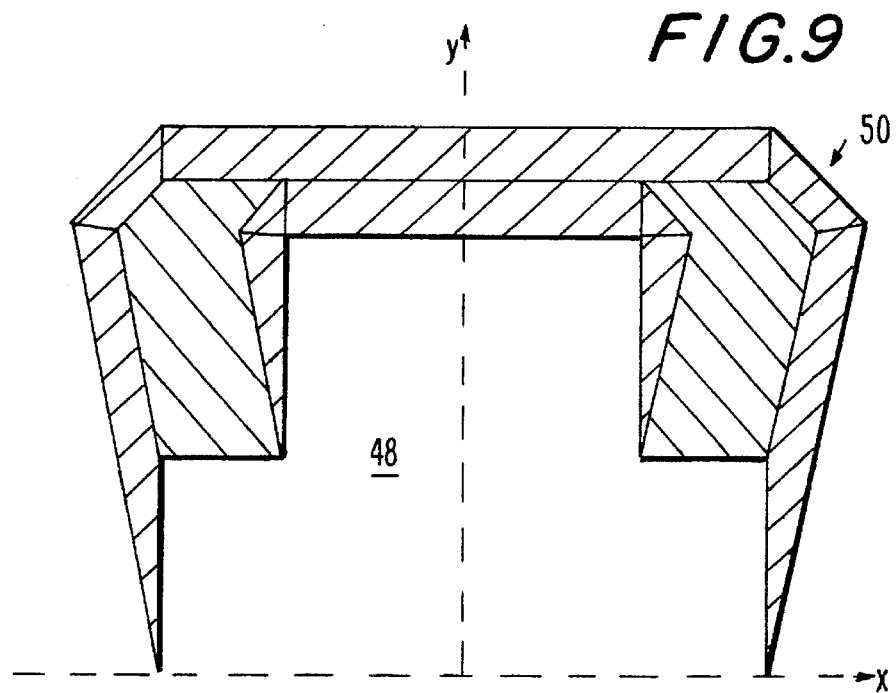
FIG. 9 shows the structure of FIG. 8 in accordance with the invention after removal of interfaces between the cavities.

The interfaces between the three cavities 42, 44, 46 in FIG. 8 can be removed without affecting the field configuration in the central cavity 46, resulting in the structure shown in FIG. 9. The field uniformity is maintained in the new main cavity 48, in spite of the discontinuity of the boundary of the cavity at $x = \pm x_0$.

The transformation of the equipotential lines $\pm\Phi_1$ into $\mu = \infty$ surfaces also allows an increase of the z dimension (the direction perpendicular to the plane of the drawing) of the central cavity to a new value $$2z_1 \geq 2z_0 \quad (1.12)$$

that can be selected independent of $2x_1$.

Figure 9A:
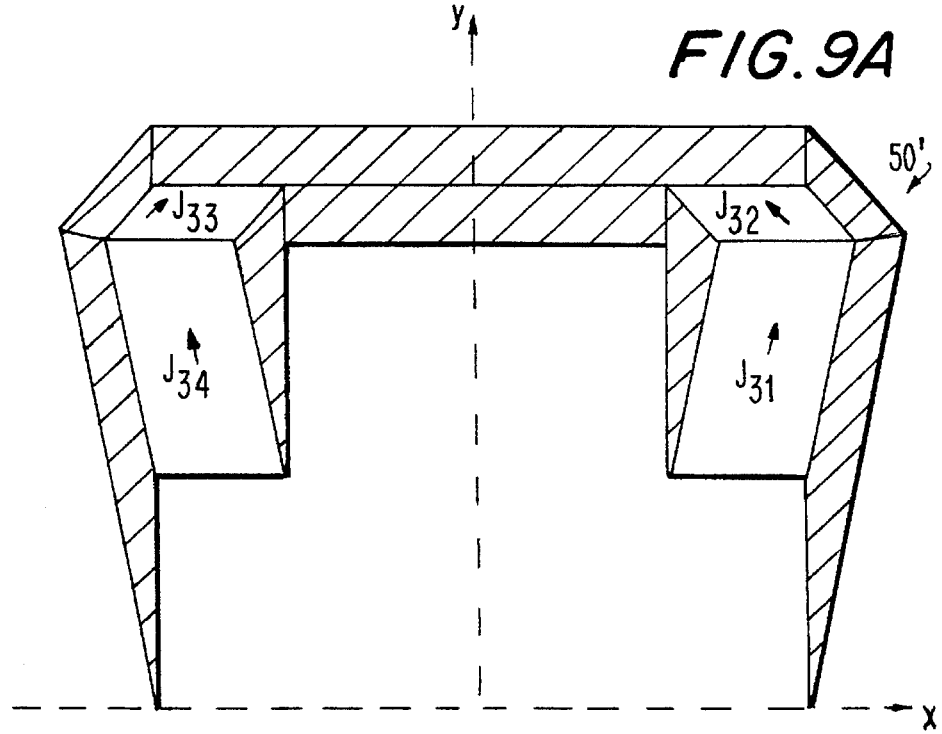
FIG. 9A illustrates a modification of the FIG. 9 embodiment with the soft ferromagnetic material replaced by permanent magnets.

The ferromagnetic material in the densely shaded areas of FIG. 9 can be replaced by magnetic material whose remanence is selected to satisfy the condition.

$$\vec{H} = 0, \quad (1.13)$$

which makes these areas equipotential. The distribution of $\vec{J}$ in both areas is shown in FIG. 9A. The four vectors are oriented parallel to the interfaces with triangular components. By virtue of Eq. (1.5) the magnitudes of the remanence are $$\begin{cases} J_{31} = J_{34} = B_{31} = B_{34} = \dfrac{K}{\sqrt{1-K^2}} J_0 \\ J_{32} = J_{33} = B_{32} = B_{33} = \dfrac{1}{\sqrt{\dfrac{2}{K}-1}} j_0 \end{cases} \quad (1.14)$$

where $B_{31}, B_{32}, B_{33}, B_{34}$ are the magnitudes of the induction in the four regions. Eq. (1.14) shows that in the range $$0 < K < 1 \quad (1.15)$$

one has $$J_{21} = J_{33} < J_0. \quad (1.16)$$

On the other hand $J_{31}$ and $J_{34}$ are smaller than $J_0$ in the range of k $$0 < K < \frac{1}{\sqrt{2}}. \quad (1.17)$$

Thus if the magnetic structure is designed with the maximum available value of remanence $J_0$. Eq. (1.17) provides the maximum value of K that can be achieved with the magnetic structure 50' of FIG. 9A.

Figure 9B:
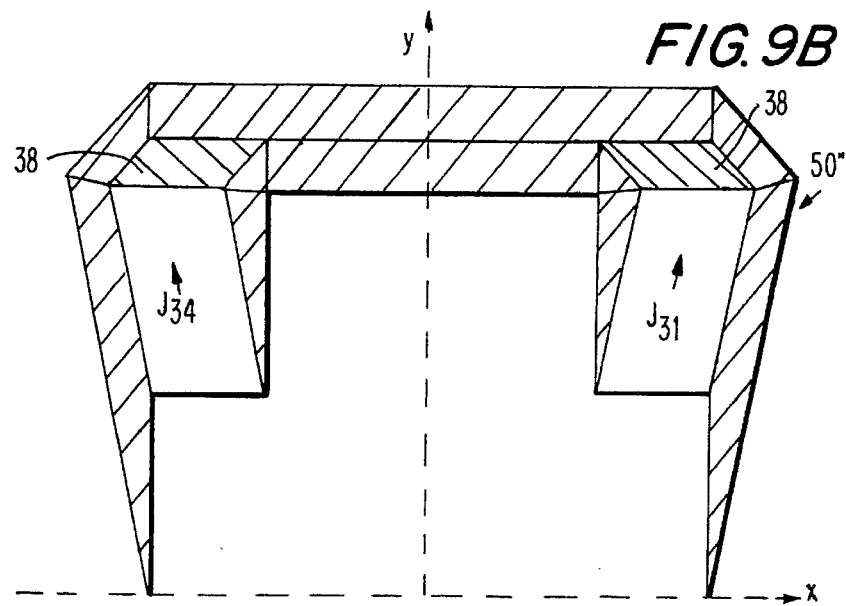
FIGS. 9B and 9C illustrate further modifications with part of the permanent magnet material replaced by soft ferromagnetic material.

Any combination of ferromagnetic material and magnetic material satisfying Eq. (1.13) can be used to generate the equipotential area required to increase the x dimension of the cavity. One such configuration 50'', for instance, is shown in FIG. 9B, where the ferromagnetic material is confined to the densely shaded area 38.

Figure 9C:
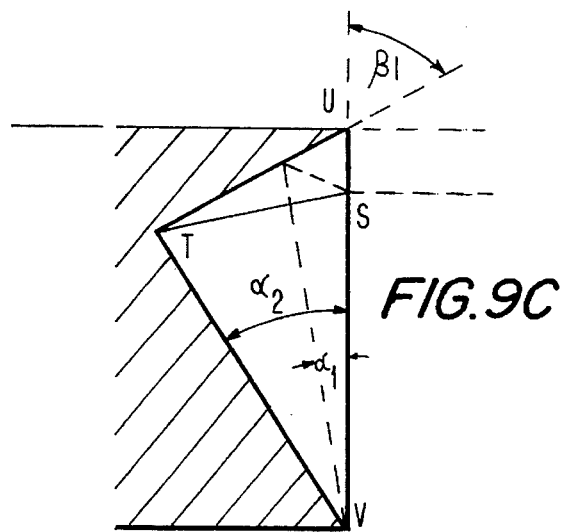

A combination of material of different remanence can also be used to design the triangular and trapezoidal components that satisfy Eq. (1.6). FIG. 9C shows the geometry of the two triangular areas (STU) and (STV) of FIG. 1.5 where the magnitude of remanences $\vec{J}_{13}$ and $\vec{J}_1$ are both equal to $J_0$ and the magnitude of remanence $\vec{J}_{12}$ is smaller than $J_0$. The new value of angle $\alpha_2$ of the component (STV) is given by $$\sin \alpha_2 = K \frac{J_0}{J_{12}} \quad (1.18)$$

The larger angle $\alpha_2 > \alpha$ resulting from the substitution of component (STV) with a material of lower remanence can be very useful in a magnet designed for a small value of K, where a small angle $\alpha_1$ can generate difficult fabrication and magnetization problems.

The closed magnetic structure 50 of FIG. 9 must be open to access the imaging region. The opening of the magnet distorts the field and the distortion must be compensated to the point where the field maintains the assigned degree of uniformity within the imaging region. The effect of the opening depends on the field orientation relative to the opening. It has been shown that a field orientation perpendicular to the opening minimizes both the distortion of the field within the cavity and the leakage of the field outside the magnet [2]. As a consequence, the magnet cavity 48 is open at both ends along the z dimension in order to insert a patient within the magnet and in addition the side wall 52 of the cavity at $x = x_1$ is open 53 to access the region of interest of the patient's body from outside. The opening 53 requires the removal of some of the components of magnetic material, as well as part of the external yoke (not shown in FIG. 10), resulting in the basic structure 54 of the schematic of FIG. 10.

Figure 10:
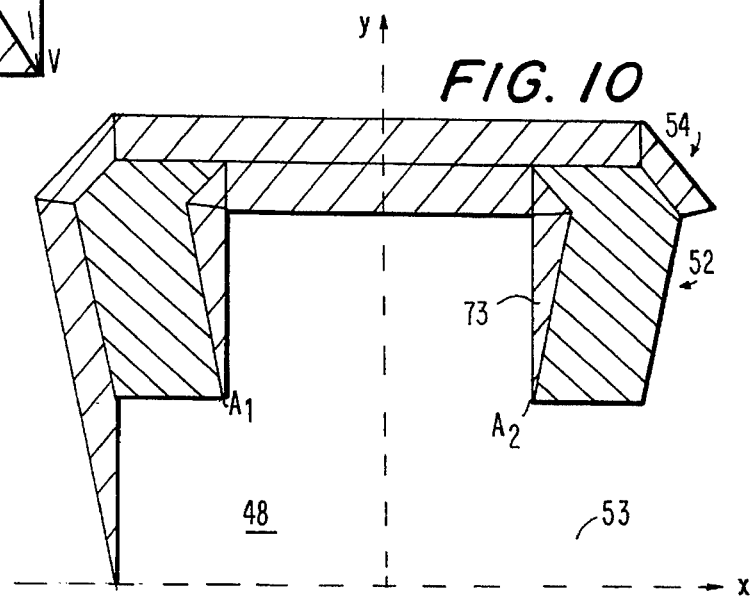
FIG. 10 illustrates in accordance with the invention an opening of the side wall and removal of a part of the yoke in the hybrid magnetic structure of FIG. 9.
Figure 11:
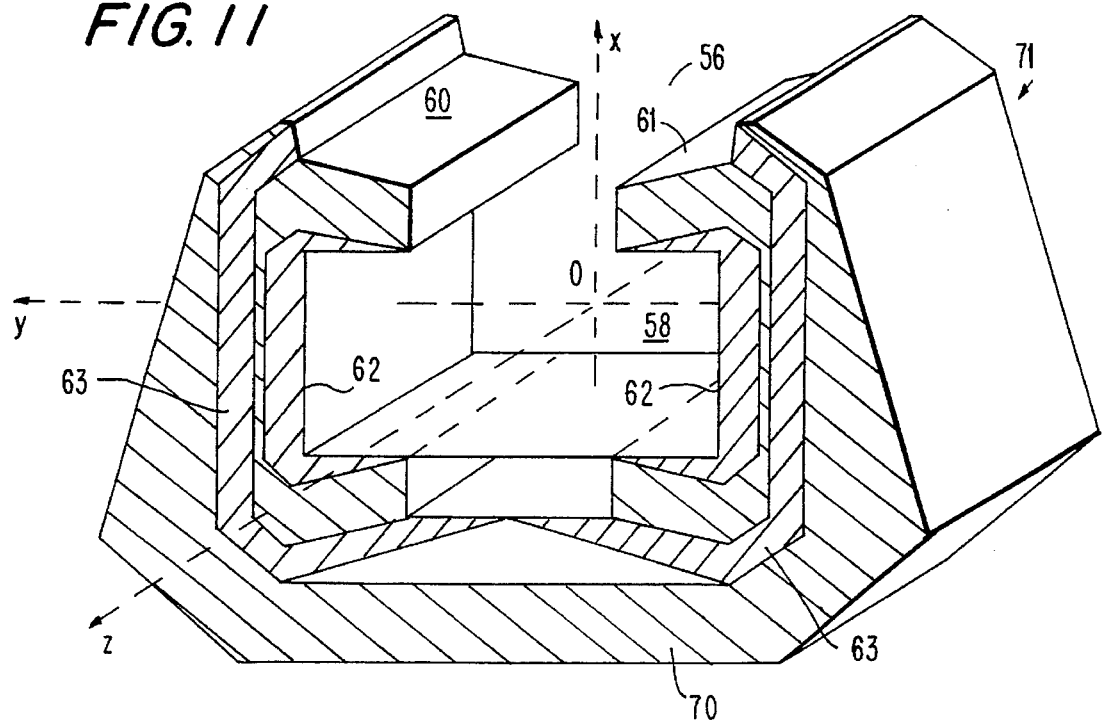
FIG. 11 is a three-dimensional view of one form of open magnet in accordance with the invention having dimensions of a main cavity large enough to accommodate a human body.

The selection of the geometrical parameters of the structure of FIG. 10 is the result of a tradeoff among conflicting constraints imposed by the desired dimensions of the imaging region, access to the patient, and the complexity of the compensation of the field distortion within the imaging region. FIG. 11 shows in perspective the full structure 71 of FIG. 10, including the yoke, rotated 90° to its normal orientation so the side wall opening 56 is at the top. In the schematic of FIG. 11, the dimensions $2x_0$, $2y_0$, $2z_0$ of the cavity 58 are selected to accept the full cross-section of a human body positioned on his or her back. The cavity is fully opened at both ends and the length $2z_0$ is selected to be large enough to minimize the field distortion caused by the openings at $z=\pm z_0$. The width $2y_1$ of the opening 56 on the top wall of the cavity is selected to minimize the access to the region of interest of the patient body. The extension $x_1-x_0$ of the cavity dimension is selected to allow the insertion of a filter structure required to compensate for a number of spatial harmonics of the field distortion, as will be discussed in the following section. The lengthening of the cavity in the z-direction is unnecessary if no additional filter structure is added at both ends of the magnet, i.e., the magnet can be designed with $z_1=z_0$.

2. Field Properties

Figure 12:
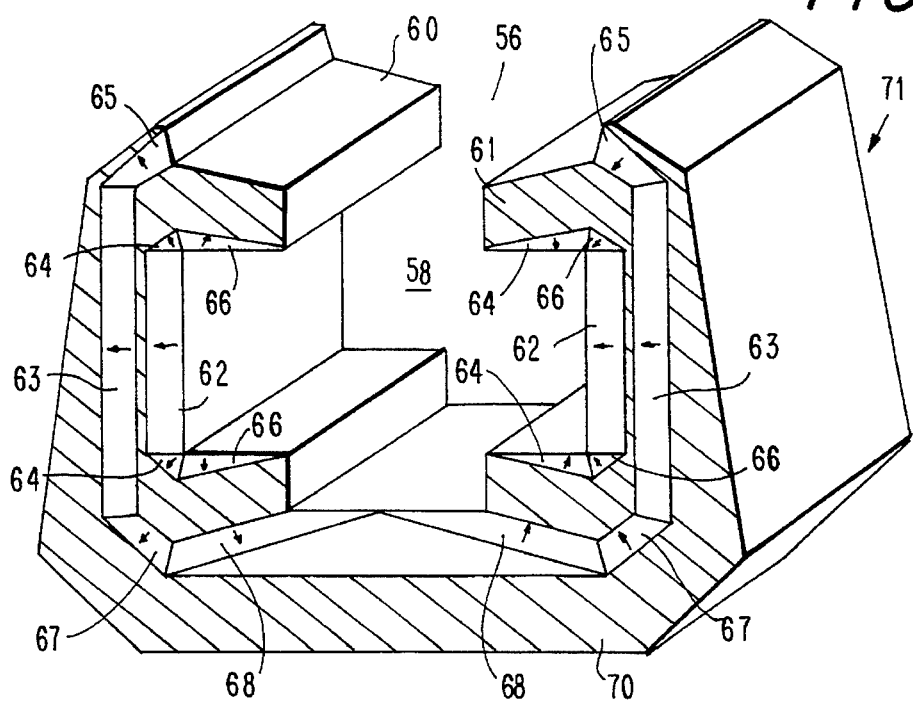
FIG. 12 shows the open two-dimensional structure of FIG. 11 showing the details of the orientation of remanence (magnetization) of the magnetic blocks.

This section analyzes the configuration of the magnetic field generated by the open hybrid structures introduced in Section 1. This structure 71 is illustrated in perspective in FIGS. 11 and 12. The ferromagnetic portions have heavy hatching in both figures, and the permanent magnetic portions have light hatching in FIG. 11 and no hatching in FIG. 12 in order to show the individual blocks and their magnetization directions by the arrows. The structure 71 shown comprises a generally C-shaped structure with side walls and a bottom wall, open-ended at opposite ends along the z-axis to allow access by a patient to the internal cavity 58, and with a large opening 56 at the top wall to allow access by a surgeon to the patient while undergoing NMR scanning. A uniform field extends in the y-direction within the cavity 58, and the center of the imaging region or region of interest is close to the origin 0 of the x-y-z coordinate system shown. The structure comprises, in each side wall, inner rectangular 62, terminated by upper and lower triangular 64, 66, permanent magnetic blocks, nested within outer rectangular 63, terminated by upper and lower trapezoidal 65, 67, 68, permanent magnetic blocks. High permeability, ferromagnetic pole pieces 60, 61 separates the nested magnetic blocks. The structure described is surrounded by a ferromagnetic yoke 70 to close the flux lines generated by the magnetic blocks.

Since field properties are influenced by the design parameter K, the cavity 58 dimensions $x_0$, $y_0$, the height $y_1$ of the opening 56, and the width $x_1-x_0$ of the internal ferromagnetic blocks 60, 61, the effect of these parameters are analyzed first. The numerical computations are based on the Boundary Elements Method (BEM) formulated in reference [1]. BEM is employed because it allows an efficient solution of the magnetostatic problems assuming linear demagnetization characteristics and a small value of the susceptibility, typical of modern magnetic material.

For practical structures, the length $z_0$ tends to be larger than $y_0$, thus minimizing the effects of truncation of the field configuration within the central imaging region.

FIG. 10 shows the geometry of the open hybrid magnet designed for K=0.3. By virtue of Eqs. (1.8) the coordinates of points $A_1$, $A_2$ in FIG. 10 are $$x_{A_2}-x_{A_1}=x_1+0.3401y_0, \quad y_{A_2}=y_{A_1}=1.0816y_0, \quad (2.1)$$

Other geometrical parameters of the open structure are $$x_0=0.5y_0, \quad y_1=0.5y_0, \quad (x_1-x_0)=0.3y_0 \quad (2.2)$$

Figure 13:
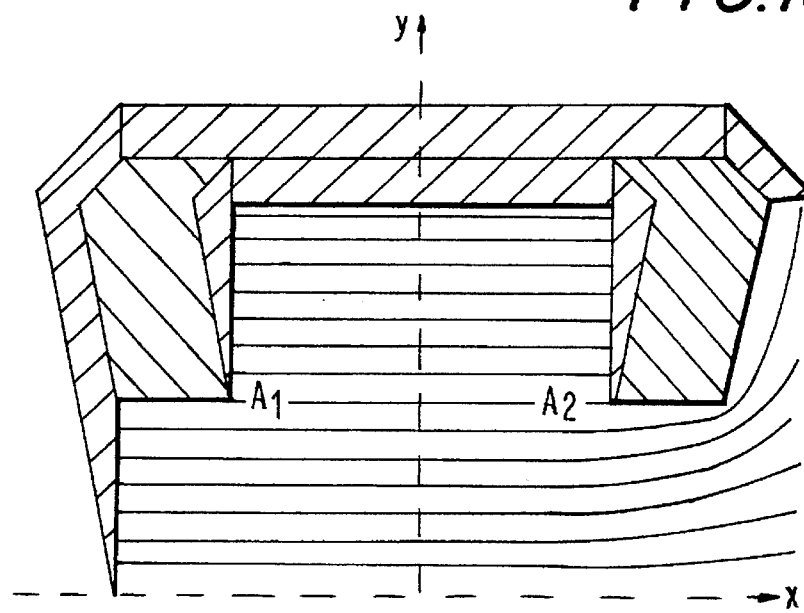
FIG. 13 shows the equipotential lines within, and FIG. 14 outside, the cavity of the open hybrid structure of FIGS. 11 and 12.
Figure 14:
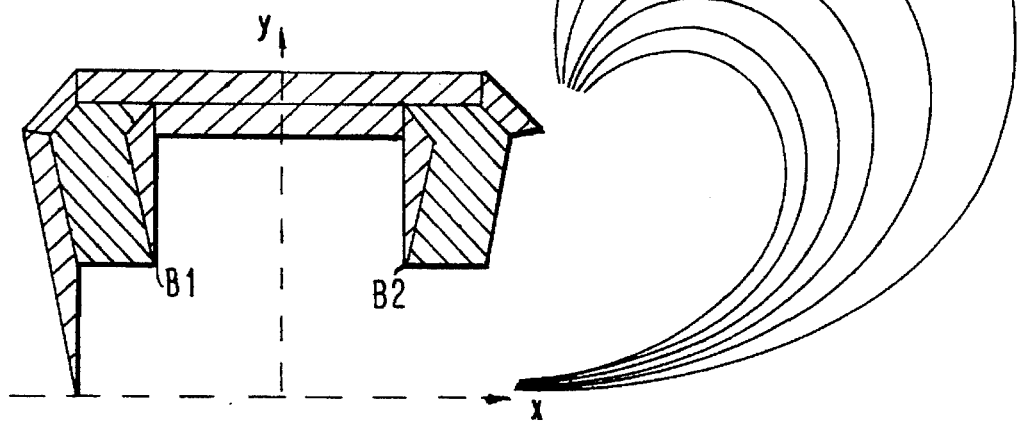

For this particular magnet configuration, shown in FIG. 13 without the external yoke, FIG. 13 shows the equipotential lines within the central cavity and FIG. 14 shows the distribution of equipotential lines outside the magnet. For $J_0$ normalized to unity, the computed value of the potential of the two $\mu=\infty$ components is $$\Phi_1 \approx -0.1371 \quad (2.3)$$

Figure 15:
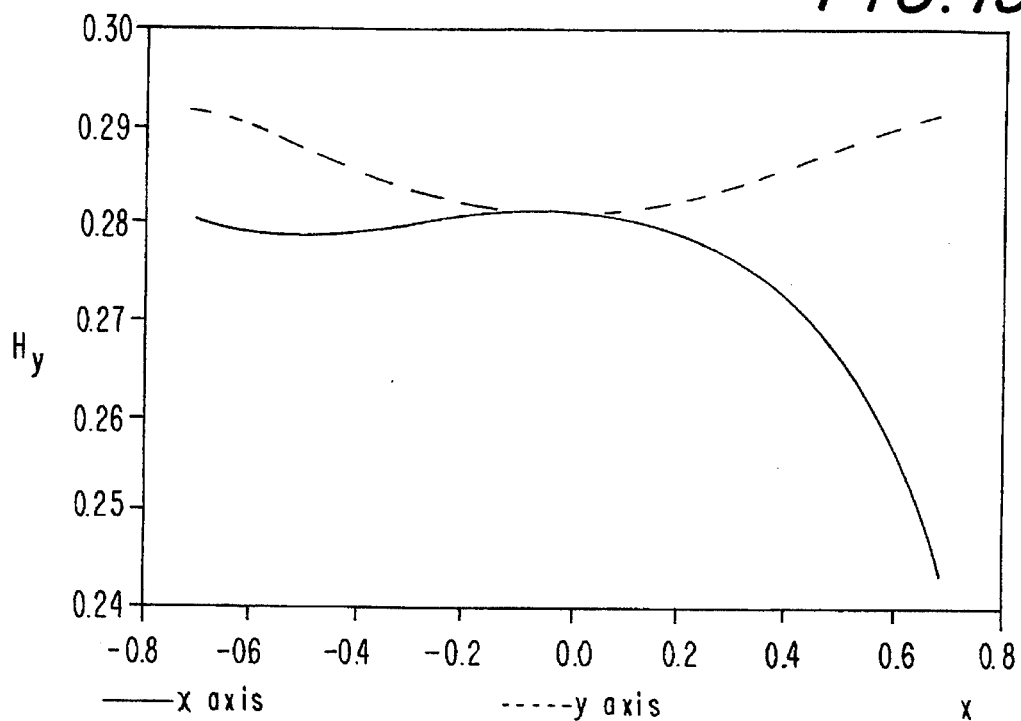
FIG. 15 is a graph of the magnetic field along the x-axis and y-axis within the cavity of the structure of FIG. 11.

FIG. 15 plots the y-component of the magnetic field along the axes x and y within the cavity for the magnetic structure. The field at the geometric center of the cavity is $0.283J_0$, which is approximately 6% less than the field for the ideal closed structure. The center of uniformity is displaced towards the negative direction of the x axis, i.e., away from the opening. The field uniformity within an imaging region of diameter $0.5y_0$ is 0.35%.

Figure 16:
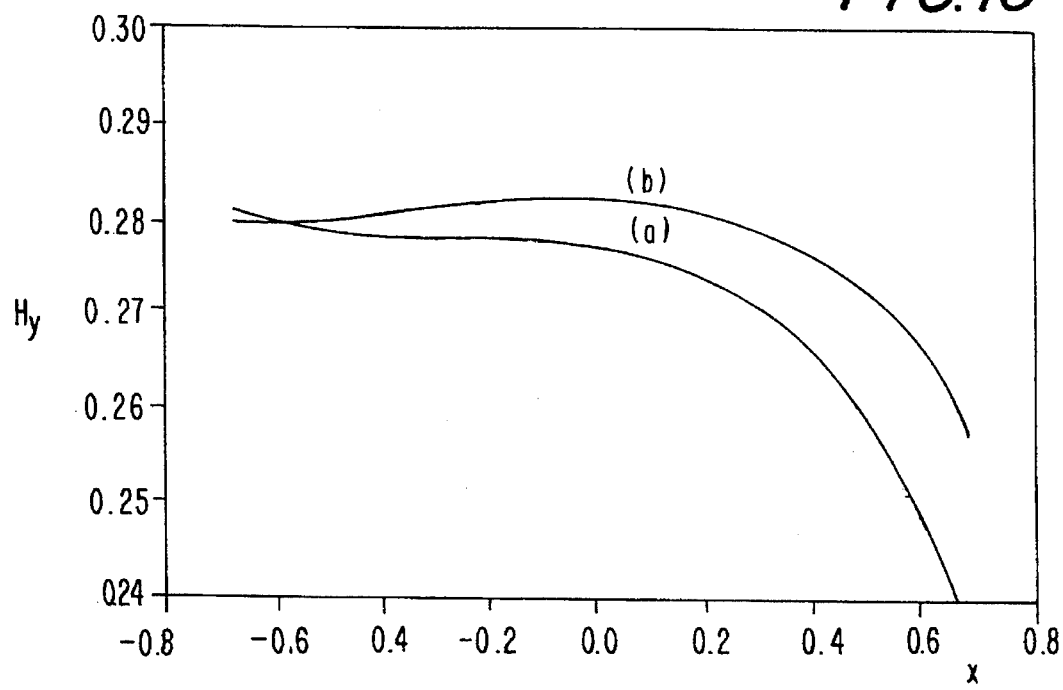
FIG. 16 is a graph of the magnetic field along the y-axis within the cavity of the structure of FIG. 11 for two different parameters.

For K=0.3, FIG. 16 considers the geometry of the magnetic structure for the two cases $$y_1=0.6y_0, \quad (x_1-x_0)=0.3y_0 \quad (2.4)$$

and $$y_1=0.5y_0, \quad (x_1-x_0)=0.4y_0 \quad (2.5)$$

By comparing FIG. 16 with FIG. 15 it can be seen that a larger opening size $y_1$ is associated with a larger loss of the field intensity at the geometric center of the cavity, while a larger width $x_1-x_0$ of the ferromagnetic block causes an increase of the field.

Figure 17:
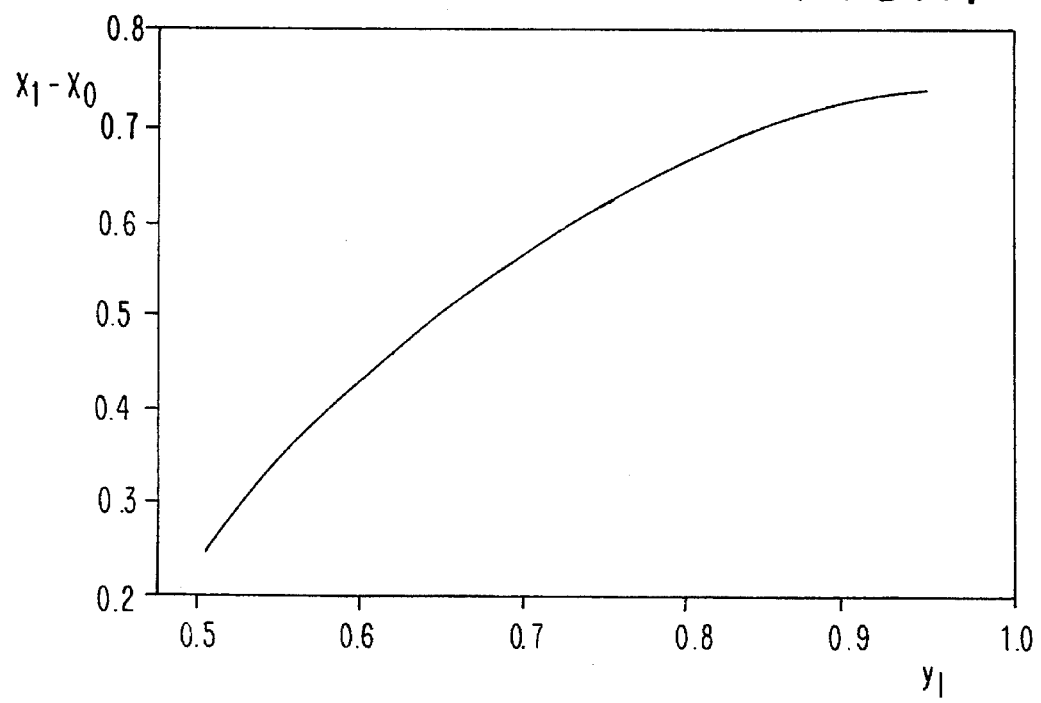
FIG. 17 is a graph depicting certain relationships of the structure of FIG. 11.

As seen in FIG. 15, the open configuration shows a loss of the field intensity to the level 0.28, as compared to the ideal closed structure, where the field is 0.30. FIG. 17 shows the relationship between the geometric parameters $y_1$ and $x_1$ that maintain a constant field value 0.28 at the geometric center of the cavity. The relationship between these two parameters indicates that the magnet design must involve a compromise between the width of the lateral opening and the length of the transition area.

By virtue of Eq. (1.2) for the closed cavity the field within the cavity is proportional to the value of parameter K. Table 2.1 lists the cross-sectional area, the value of field $H_0$ at the geometric center of the open magnet, and $H_0$ normalized to the field $H_0^c$ in the ideal closed magnet for K in the range 0.1–0.5. While field intensity $H_0$ in the open structure remains essentially proportional to K, the loss of field relative to a closed magnet increases with K.

TABLE 2.1

| K | Area | $H_0$ | $H_0/H^c$ |
|---|---|---|---|
| 0.1 | 0.445 | 0.096 | 96% |
| 0.2 | 1.037 | 0.190 | 95% |
| 0.3 | 1.831 | 0.281 | 94% |
| 0.4 | 2.922 | 0.373 | 93% |
| 0.5 | 4.477 | 0.465 | 93% |

Figure 18:
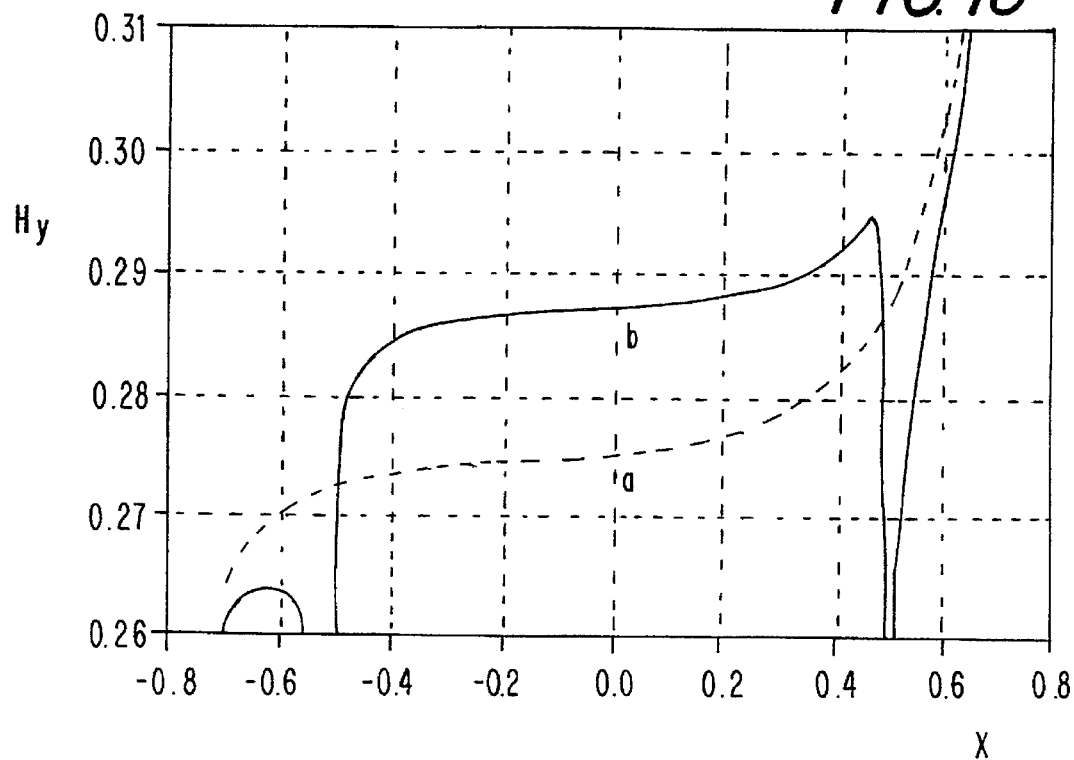
FIG. 18, 19 and 20 are, respectively, a graph of Hy, magnetic properties of certain magnetic\ferromagnetic configurations, and a graph illustrating the change of potential in the development of an embodiment of the invention.

As shown in section 1, in the fully closed magnet the field is not affected by the removal of the $\mu=\infty$ interfaces between central and lateral cavities. This is not true any longer in the open magnet, because the field is not uniform in the open central cavity. The effect is illustrated in FIG. 18 that shows the component $H_y$ on the line $y=y_1$ before and after removal of the interfaces between the central and the lateral cavity for the two-dimensional cavity. In FIG. 18 curve (a) shows the slow increase of $H_y$ versus x before the removal and curve (b) shows that a large field distortion has to be expected close to the corners of the $\mu=\infty$ material after removal of the interface.

Figure 19:
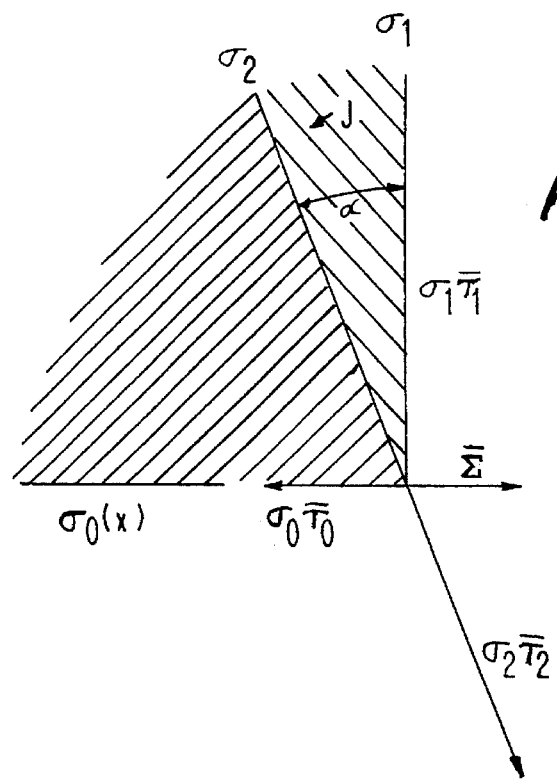

To analyze the field discontinuity at the corners $A_1, A_2$ (FIG. 10), consider the two-dimensional schematic of FIG. 19 where $\sigma$ is the surface charge density induced by the field in the central cavity on the interfaces at $y=y_1$ in the absence of the lateral cavity. In the range $-x_1 < x < x_1$, the surface charge density $\sigma$ is given by $$\sigma = \mu_0 H_y(x, y_1) = -KJ_0 f(x) \tag{2.6}$$

where the nondimensional function $f(x)$ is positive if $H_y$ is oriented in the positive direction of axis y. In the limit of the fully closed magnet one has $$f(x) = -1 \tag{2.7}$$

The wedge of magnetic material shown in FIG. 19 is the triangular component of a lateral cavity whose edge is located at $$x = x_0, y = y_1. \tag{2.8}$$

Let $\vec{J}$ be the remanence of the wedge of magnetic material perpendicular to its surface $$\frac{y - y_1}{x + x_0} = -c \tan \alpha \tag{2.9}$$

where angle $\alpha$ is given by $\sin \alpha = K$. The surface charge densities $\sigma_1, \sigma_2$ induces by $\vec{J}$ on the surface of the wedge are given by $$\begin{cases} \sigma_1 = J \cos \alpha = -J\sqrt{1K^2} \\ \sigma_2 = J \end{cases} \tag{2.10}$$

In FIG. 19 vectors $\vec{\tau}_0, \vec{\tau}_1, \vec{\tau}_2$ are unit vectors parallel to the interfaces where charges $\sigma_0, \sigma_1, \sigma_2$ are located and pointing away from the interfaces. By virtue of Eq. (2.10) one has $$\vec{\Sigma} = \sigma_1 \vec{\tau}_1 + \sigma_2 \vec{\tau}_2 = J \sin \alpha \vec{\tau}_0 = KJ \vec{\tau}_0 \tag{2.11}$$

Thus, vector $\vec{\Sigma}$ is always oriented in the direction of axis x, as indicated in FIG. 19. By virtue of the theorem of existence of a uniform field in a prismatic structure of magnetic material [1], vector $\vec{\Sigma}$ must cancel vector $\sigma_0 \vec{\tau}_0$, i.e., $$\vec{J} = \vec{J}_0 f(-x_0) \tag{2.12}$$

Thus if the magnitude of $\vec{H}_y$ is smaller than $H_0$, one has $$J < J_0 \tag{2.13}$$

Because the field is not uniform within the cavity, the cancellation of the field singularity generated at point $A_2$ of coordinates $$x = x_0, y = y_1 \tag{2.14}$$

by the removal of the $\mu = \infty$ interface requires a different value of $\vec{J}$ in the wedge whose edge is located at point $A_2$. Thus, the singularities at points $A_1, A_2$ are cancelled by properly selecting the value of $\vec{J}$ in the triangular wedges. However, because of inequality given by Eq. (2.13), the condition of existence of uniform field is not satisfied at the far corners $B_1, B_2$ of the lateral cavity indicated in FIG. 14, and a field singularity is generated at those corners. Because of the larger distance of these points from the central cavity, the field distortion within the imaging region is minimized and can be compensated by filter structures [4]. The analysis of the filter structures designed to achieve a desired degree of field uniformity is presented in the following section.

Figure 20:
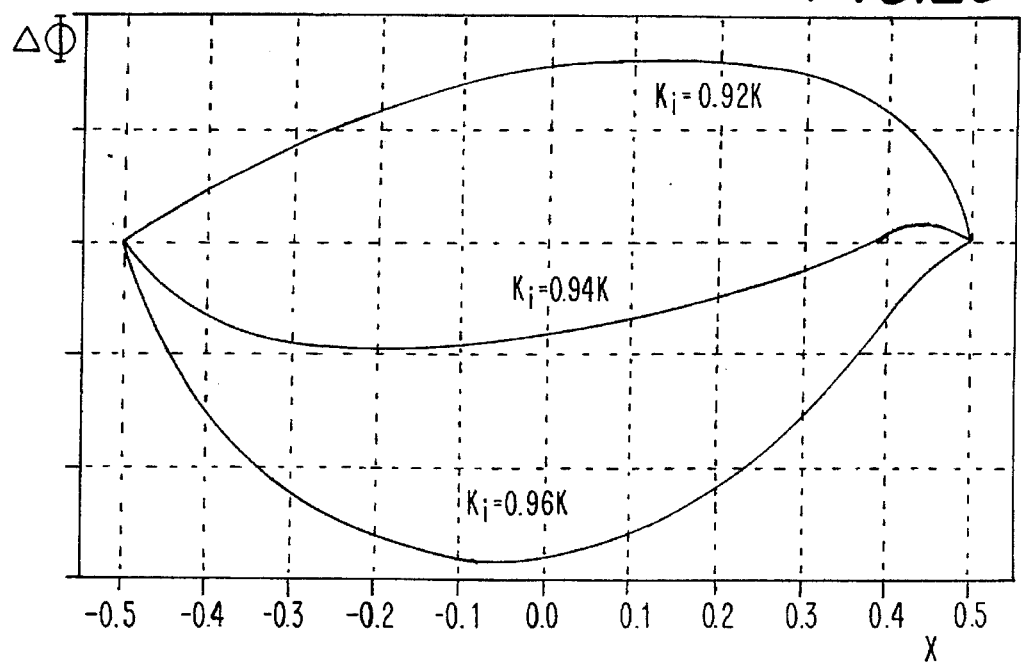

The mismatch of the field at the interface between central and lateral cavities can be reduced by designing the lateral cavities for a value of $K_i$ lower than $K$. FIG. 20 plots the potential on the line $A_1, A_2$ (FIG. 13) for several values of $K_i/K$, demonstrating a significant reduction of the nonuniformities in the central region of the magnet cavity.

As shown in Section 1, the equipotential ferromagnetic components can be replaced, either totally or partially, by magnetic materials whose remanence is selected to be equal to the magnetic induction. Thus the schematic of FIG. 10 can be transformed into the structure of FIG. 21 where the heavy arrows indicate the orientation of the remanence in the new components.

To minimize the field distortion due to the opening of the magnet the field singularities at the two new corners $A'_1, A'_2$ must be eliminated. The cancellation of the singularities is a particular case of the configuration of FIG. 22 that shows the $\mu = \infty$ wedge interfacing with the two media where the field intensities $\vec{H}_0, \vec{H}_1$ are perpendicular to the faces of the wedge. The wedge is equipotential and the surface charge densities on its faces are $$\sigma_0 = \mu_0 H_0, \quad \sigma_1 = \mu_1 H_1. \tag{2.15}$$

The charge density $\sigma$ on the interface between the two wedge is $$\sigma = \mu_0 H_0 \cos(\alpha_0 - \alpha) + \mu_0 H_1 \cos \alpha \tag{2.16}$$

where angle $\alpha$ satisfies the boundary condition $$H_0 \sin(\alpha_0 - \alpha) = H_1 \sin \alpha \tag{2.17}$$

Figure 22:
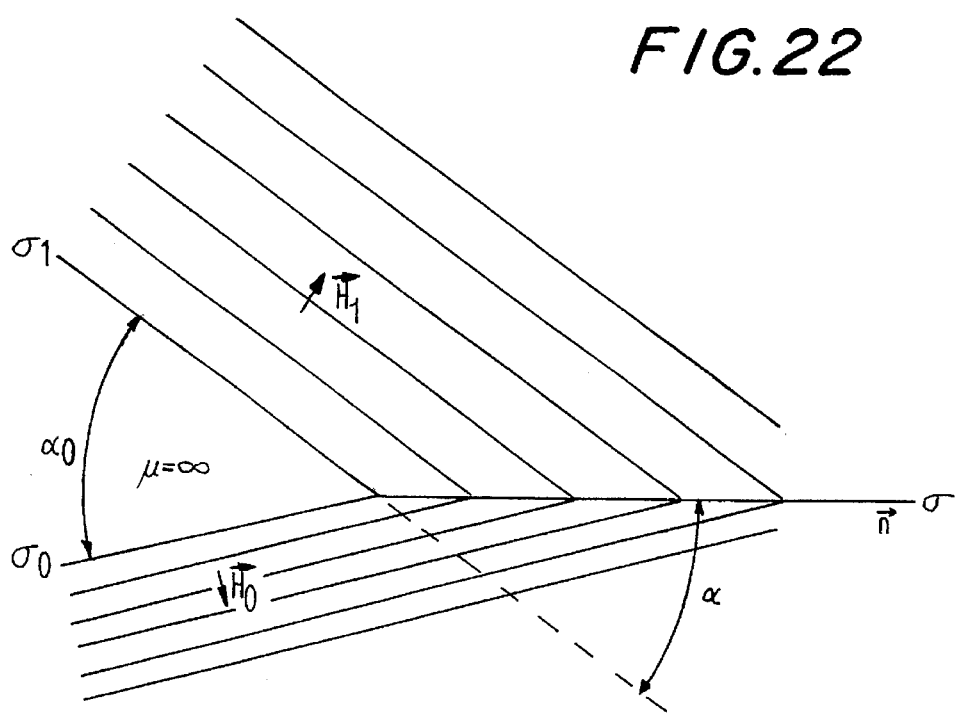
FIG. 22 and 23 show the equipotential lines for certain magnetic structures.

Assume that the region of intensity $\vec{H}_0$ is a non-magnetic medium and the region of intensity $\vec{H}_1$ is a magnetic medium of remanence $\vec{J}$. By virtue of Eq. (2.17), $\vec{J}$ satisfies the equation $$\sigma = \vec{J} \cdot \vec{n} \tag{2.18}$$

where the unit vector $\vec{n}$ is perpendicular to the interface between magnetic and nonmagnetic media, and is oriented toward the non-magnetic medium, as shown in FIG. 22. The component of $\vec{J}$ parallel to the interface between magnetic and non-magnetic media can be chosen arbitrarily. Thus, the orientation of $\vec{J}$ can be selected to direct the flux in the same arbitrary direction in both the magnetic medium and the ferromagnetic medium.

Figure 23:
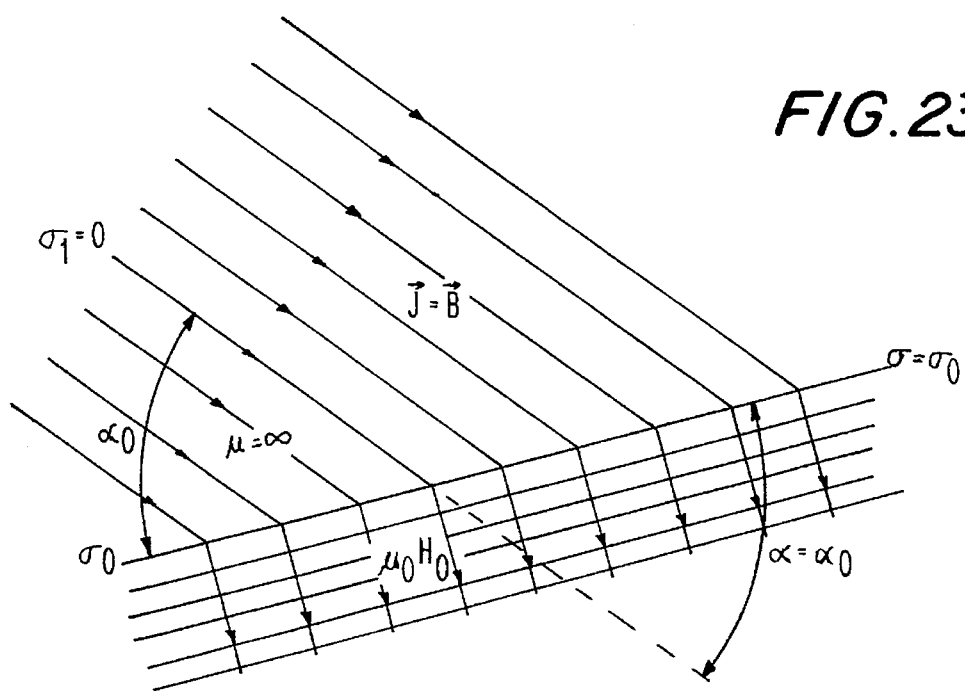

In the particular case shown in FIG. 23, where $$\alpha = \alpha_0, \tag{2.19}$$

one has $H_1 = 0$, i.e., the region of the magnetic material is equipotential, and by virtue of Eqs. (2.15) and (2.16)

$$\sigma_1 = 0, \sigma = \sigma_0 \tag{2.20}$$

Thus the theorem of existence of a uniform field in the proximity of the edge of the wedge is satisfied. If the remanence $\vec{J}$ is selected to be parallel to the interface between the $\mu = \infty$ wedge and the magnetic material, where $\vec{J} = \vec{B}$, the lines of flux of the magnetic induction are parallel to the same interface in both media as shown in FIG. 23.

Figure 21:
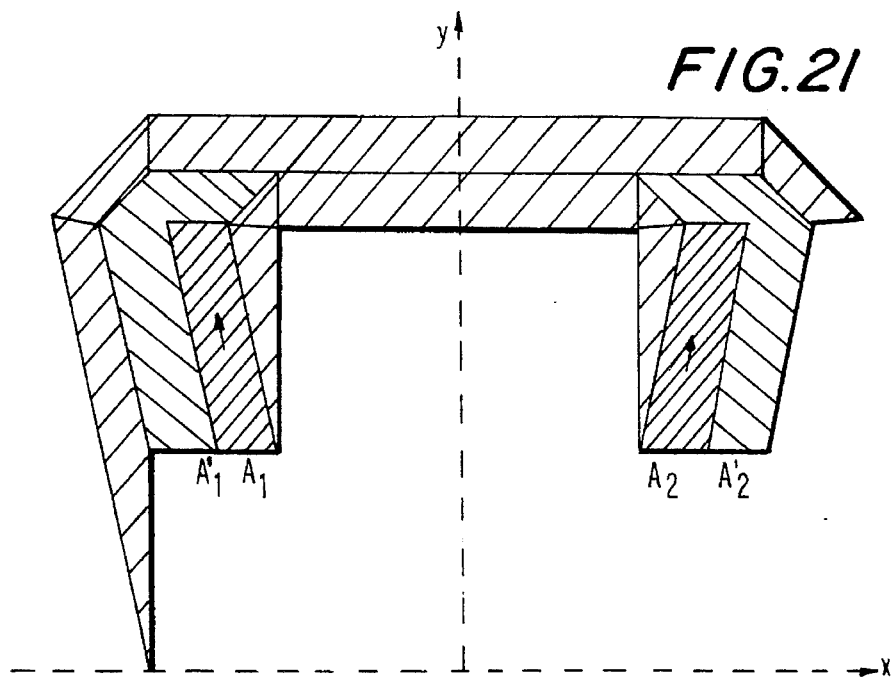
FIG. 21 shows a modification of the structure illustrated in FIG. 10.

The transformation of the magnetic structure of FIG. 10 into the structure of FIG. 21 results in $A_1, A_2$ being the points of intersection of magnetic material only. With the removal of the $\mu=\infty$ material from $A_1$ and $A_2$, a singularity of the field intensity at both points is eliminated if charge densities $\sigma_1, \sigma_2$ defined by Eqs. (2.10) satisfy the condition $$\vec{\sigma_1 \tau_1} + \vec{\sigma_2 \tau_2} + \vec{\sigma \tau_0} = 0 \qquad (2.21)$$

where $\vec{\tau}_0, \vec{\tau}_1, \vec{\tau}_2$ are the unit vectors defined in FIG. 19 and $\sigma$ is the surface charge density given by Eq. (2.18). Thus the field singularities at points $A_1, A_2$ are eliminated regardless of the field distribution within the cavity.

Figure 24:
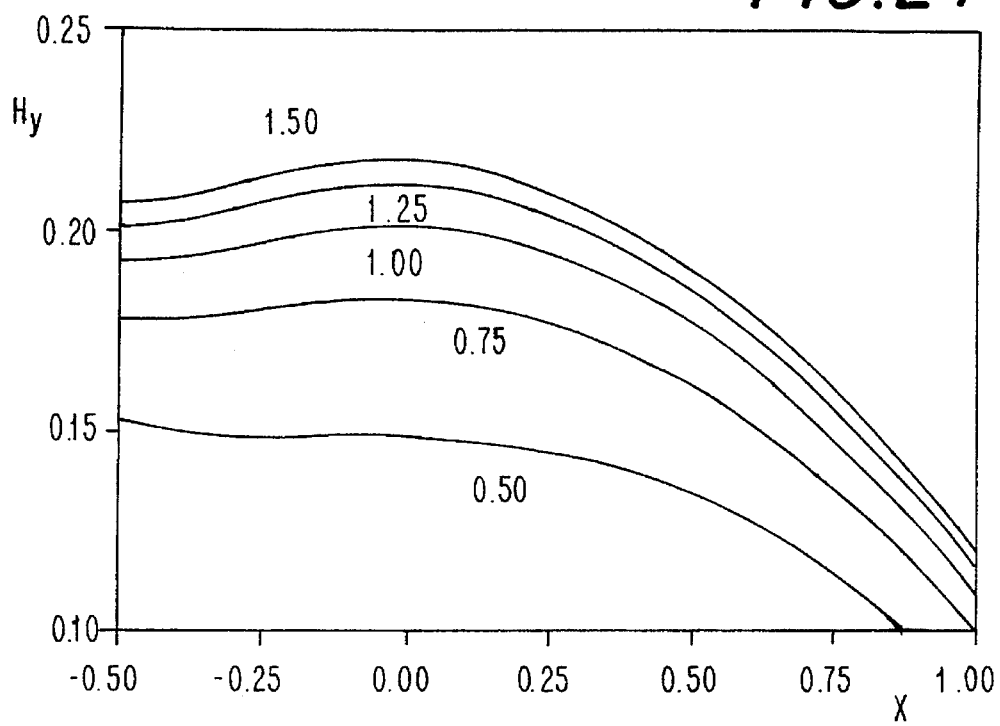
FIG. 24 is a graph of the distribution of the magnetic field along the x-axis for various structures.

As shown in the schematic of FIG. 14, the side opening of the magnet cavity generates a relatively small perturbation of the uniform field for the two-dimensional structure. To analyze the field distribution of a three-dimensional open magnet, we assume that the structure of FIG. 14 is truncated at the planes $z=\pm z_0$, as shown in FIG. 11. FIG. 24 plots the magnetic field $H_y$ along the x axis of the cavity for several values of the length $z_0$. As seen in the figure, as long as the length $2z_0$ is sufficiently larger than the transveral dimension $2y_0$ of the cavity, further increase of the length adds only limited improvements to the field strength and its uniformity. It is also seen that the two-dimensional computation describes rather accurately the distribution of the magnetic field in the central region of the magnet.

A three-dimensional computation was performed to analyze the behavior of the fringe field as the distance from the magnet increase. As an example, assume a length $z_0$ of the open magnet $$z_0 = 1.25\, y_0 \qquad (2.22)$$

Figure 26:
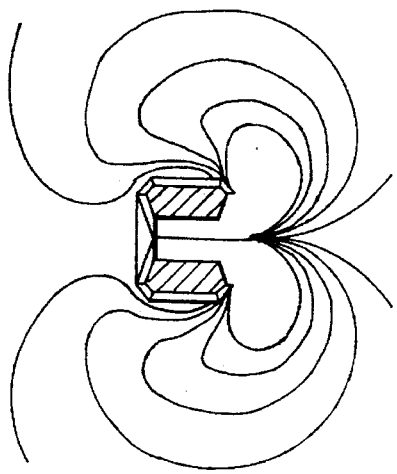
FIGS. 26 and 27 show the equipotential lines outside the structure of FIG. 11 viewed from two different directions.
Figure 27:
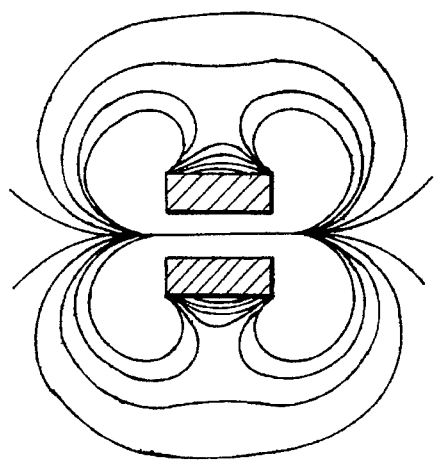

The equipotential lines outside the magnet are plotted in FIGS. 26 and 27. At a large distance from the magnet, the equipotential lines correspond to the field of a magnetic dipole located at the center of the magnet and oriented in the direction of the y-axis.

Figure 28:
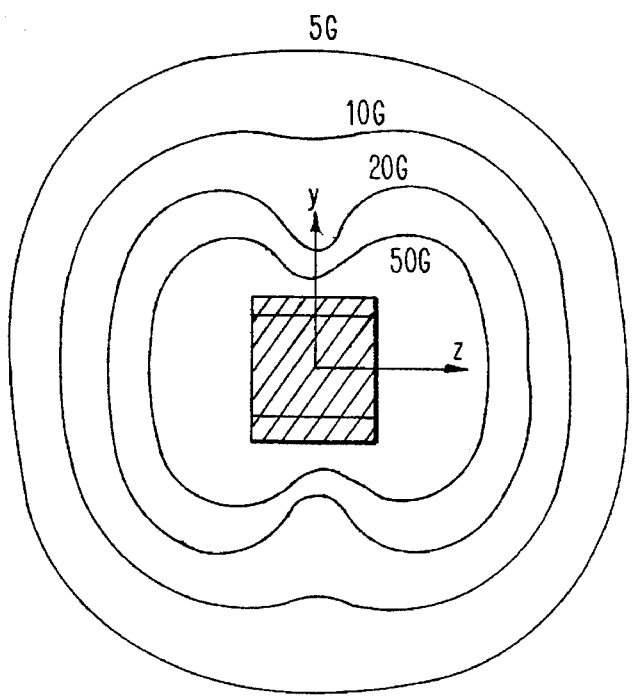
FIG. 28 shows the intensity of the fringe field.

The magnitude of the field on the x=0 plane for a structure given by Eq. (2.22) is shown in FIG. 28. The fringe field is shown by plotting the curves of constant field, the magnitude of H assuming K=0.3 and $J_0$=1.25 T, corresponding to a neodymium-iron-boron alloy, rare-earth, high energy type magnetic materials being used. In particular, in spite of the large opening in the side wall, the stray field is low, with the 5 Gauss line, which is normally assumed to define the extent of the fringe field, found close to the sphere of radius 6.7 $y_0$.

Figure 25:
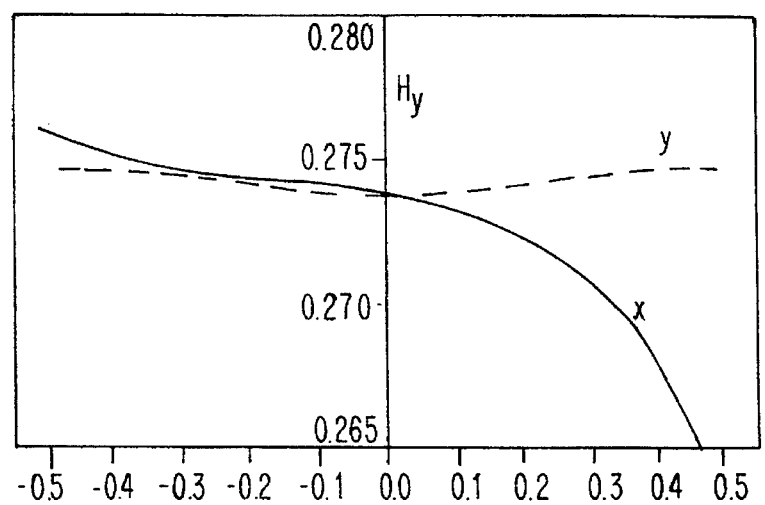
FIG. 25 is a plot of the magnetic field along the x and y axes within the cavity of the structure of FIG. 11.
Figure 29:
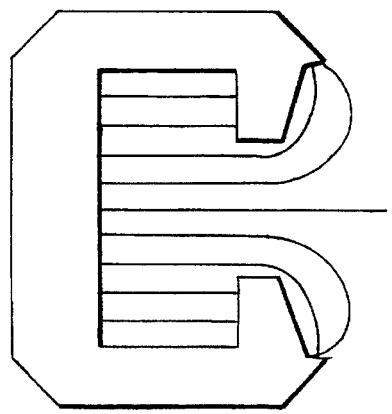
FIG. 29 shows the equipotential lines within the cavity.

The plot of the y-component of the magnetic field along the x and y axes within the cavity 72 is shown in FIG. 25. It is seen that the region of highest uniformity is located in the central region of the cavity, in contrast to the field configuration of traditional C-magnets. The center of uniformity is at the point x=−0.15, y=0, and the field uniformity within an imaging region of diameter 0.5 $y_0$ is 0.35%. FIG. 29 is a cross-section of the full structure showing the equipotential lines of the field in the cavity.

3. Filter Structure

This section analyzes the problem of the compensation of the field distortion within the imaging region of the open magnet of FIG. 11. The compensation is based on the addition of a filter structure designed to cancel the dominant spatial harmonics of the field within the imaging region. The cancellation extends to the number of harmonics necessary to achieve the required field uniformity.

The basic theory of the design of filter structures has been presented in recent publications by the authors [4,5,6]. The theory is based on the modulation of the magnetostatic potential at the interface between the magnetic structure and the central cavity, accomplished by sandwiching elements of permanent magnetic material 200 between the main body of the soft ferromagnetic components 202 and magnetically insulated plates of soft ferromagnetic material 204 as indicated in the schematic of FIG. 30.

Figure 40:
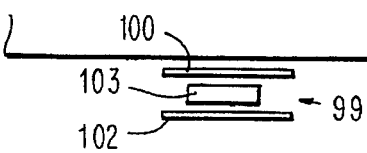
Figure 40A:
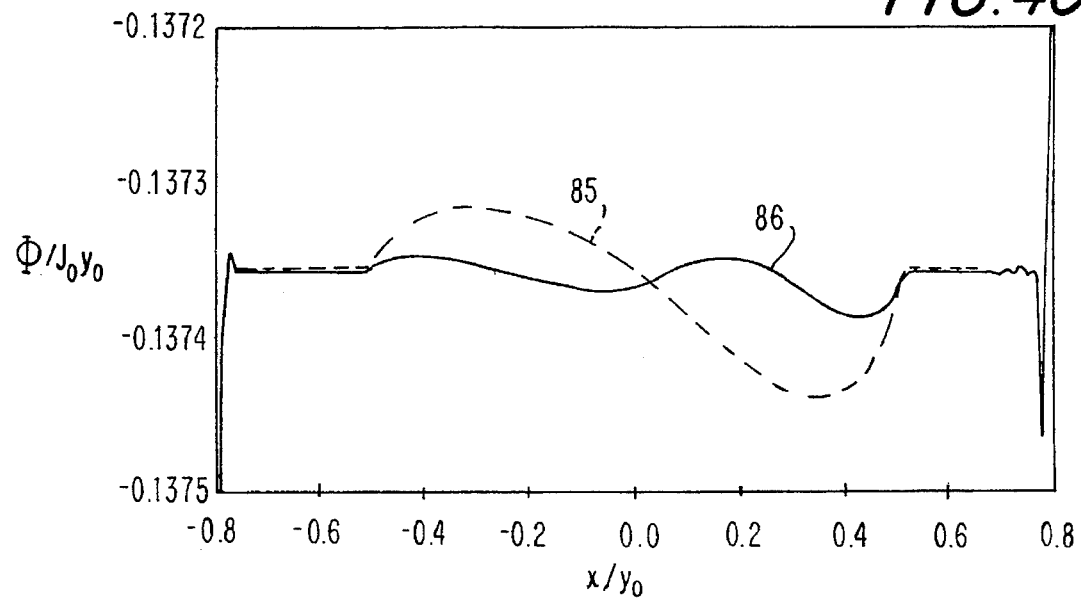
FIGS. 40A–40C are graphs showing the effect of singularities in the magnetic structure of the invention.
Figure 40B:
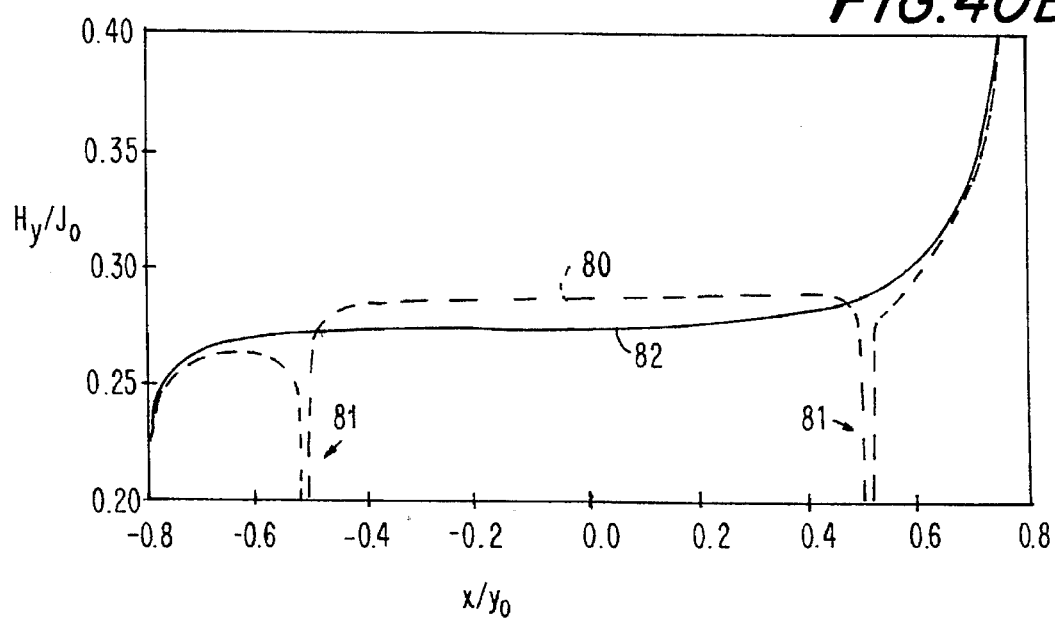

For simplicity, this section is limited to the two-dimensional problem of the compensation of the field distortion caused by the opening of the magnet in the limit $z_0=\infty$, and the necessary modifications will be described only for the half of the magnet in the region y>0 with the corresponding symmetrical changes to the other half of the magnet being implicit. FIG. 40B below will illustrate the field distortion and in particular the singularities generated by the field mismatch between the central and lateral cavity. In order to minimize this mismatch, a preferred form of the compensation of the field distortion proceeds in three steps.

The first step assumes the presence of a hypothetical $\mu=\infty$ membrane 206 between the central 208 and lateral 210 cavity (FIG. 31). The compensation of the field distortion in the central cavity 208 is achieved by means of a filter structure 212 located on the surface of the ferromagnetic pole pieces 202 in the region $$x_0 < |x| < x_1 \qquad (3.1)$$

This filter structure, which can be designed to generate a highly uniform field in the central cavity 208 and is shown in an enlarged scale in FIG. 30, provides the major portion of the field compensation.

Because the compensation of the field distortion in the central cavity 208 is not intended to restore the value of the field in the closed magnet, the second step is a modification of the lateral cavity 210 so as to minimize the effect of the field mismatch following the removal of the $\mu=\infty$ membrane 206. The modification can either be a lowering of the remanences of the magnetic components in the lateral cavity or of the lateral cavity's value of K, as discussed in Section 2. To further reduce the perturbation caused by the removal of the $\mu=\infty$ membrane, part of the ferromagnetic components 202 can be replaced with insertions of magnetic material 215 (see FIG. 35) that are designed to help maintain the field uniformity. The third step is a final tuning of the filter structure and minor adjustments of the remanences of selected magnetic components in order to obtain the largest possible imaging region.

The first step of the compensation begins by expanding the potential in the central cavity as $$\Phi(x,y) = \Phi_1 \frac{y}{y_1} + \sum_{n=1}^{\infty} \sin(n\pi y/y_1) \qquad (3.2)$$

$$[a_n \cosh(n\pi x/y_1) + b_n \sinh(n\pi x/y_1)],$$

where $\Phi_1$ is the potential of the $\mu=\infty$ membrane that closes the lateral cavity at $y=y_1$. To improve the uniformity of the field, the filter structure is designed to cancel a specified number of the harmonics in the expansion (3.2). since the coefficients $a_n$ and $b_n$ decrease rapidly with increasing n, only the first few harmonics need to be cancelled in order to obtain a highly uniform field.

FIG. 31 shows the magnet with a filter structure 212 designed to cancel the terms having n≤3. The filter's magnetic sandwiches are labeled with an index $l=\pm 1, \pm 2, \ldots$, with positive l's corresponding to sandwiches having positive x coordinates and negative l's to those having negative x coordinates. The pair of sandwiches farthest from the center of the magnet are labeled $l=\pm 1$, the next farthest pair $l=\pm 2$, and so forth. The magnitudes of the potential shifts that must be generated by the sandwiches in order to cancel the specified harmonics may be minimized by choosing the horizontal width $\Delta x_1$ for the filter's lth sandwich according to the rule [2].

$$\Delta x_1 \approx \frac{y_1}{l l \pi} . \quad (3.3)$$

Figure 33:
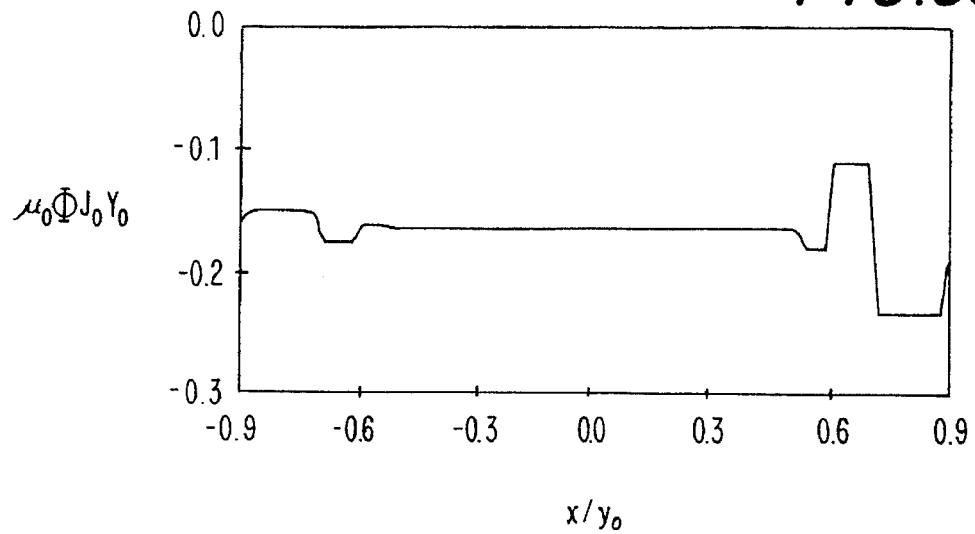
FIG. 33 is a graph showing shifts needed to cancel leading harmonics.
Figure 34:
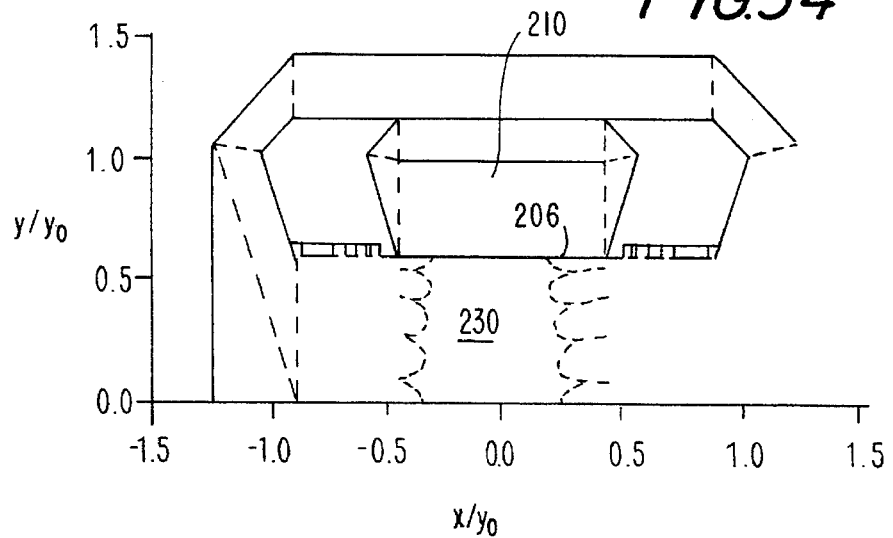
FIG. 34 shows the imaging region obtained after the first compensating step.

The coefficients $a_n$ and $b_n$ depend linearly on the sandwich potentials, and therefore the potentials required to cancel the selected harmonics can be determined by solving a system of linear equations [4,5,6]. The table in FIG. 32 lists the harmonics coefficients before and after the cancellation of the harmonics with $n \leq 3$ obtained for the geometry given by FIG. 31, and FIG. 33 plots the potential at $y=y_1$, showing the shifts that must be produced by the sandwiches, represented as 6 steps in order to cancel the leading harmonics. The outline of the imaging region 230 having a uniformity of better than 50 ppm is shown in FIG. 34. The approximate periodicity of the outline reflects the n=4 harmonics, which are the dominant remaining terms in the expansion (3.2).

Figure 35:
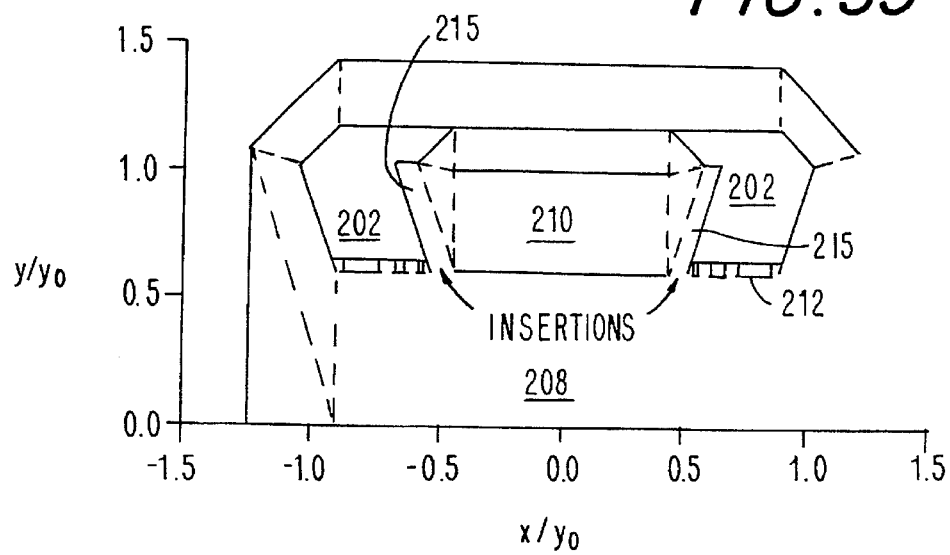
FIG. 35 shows the provision of magnetic insertions to reduce field distortion.

If the $\mu=\infty$ membrane 206 were removed at this point, strong singularities would be produced at the corners by the opening to the lateral cavity 210, as described in Section 2, spoiling the uniformity of the central field. To prevent this, either the $\vec{J}$ or the K of the lateral cavity is lowered so that the fie].d it produces matches that in the central cavity just below the center of the $\mu=\infty$ membrane. Additionally, insertions 215 of permanent magnetic material replace part of the ferromagnetic components 202 near the lateral cavity 208 as illustrated in FIG. 35. The remanences of the insertions are chosen so that the magnetic field vanishes inside them. This condition guarantees that the field in the central cavity 208, with the $\mu=\infty$ membrane still in place, is unaltered. The required remanences are nonuniform and can be determined from the equation $$\vec{J}(x,y) = H_y \left[ x \mp (y-y_1) \frac{K}{\sqrt{1-K^2}} \right] \left( \vec{x} \pm \vec{y} \frac{K}{\sqrt{1-K^2}} \right) \quad (3.4)$$

where $H_y(x)$ is the magnetic field just below the plane $y=y_1$ prior to the introduction of the insertions. The upper sign applies to the insertion with $x>0$ and the lower sign to the one with $x<0$ the orientation $\vec{J}$ in the insertions is perpendicular to that in the adjacent triangles 36, 37 of magnetic material (FIG. 5).

Figure 36:
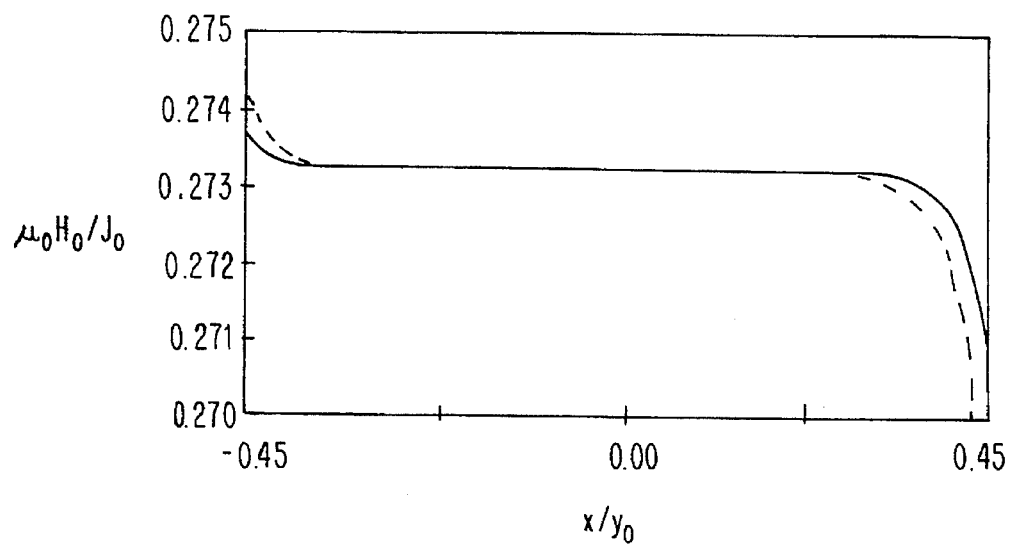
FIG. 36 is a graph comparing field uniformity under two conditions.

The purpose of the insertions 215 is to fix the magnetic charge near the opening to the lateral cavity 210 so that the charge is consistent with the highly uniform field obtained in the first step of the compensation. FIG. 36 compares the magnetic field across the opening to the lateral cavity 210 before (dotted) and after (solid) the removal of the $\mu=\infty$ membrane 206. Remarkably, the field uniformity is actually improved by the removal of the membrane, suggesting that the lateral cavity 210 acts as a field stabilizer for the central cavity 208. The reason for this is that the removal of the membrane forces the field, and not just the potential, to be continuous across the opening.

Figure 37:
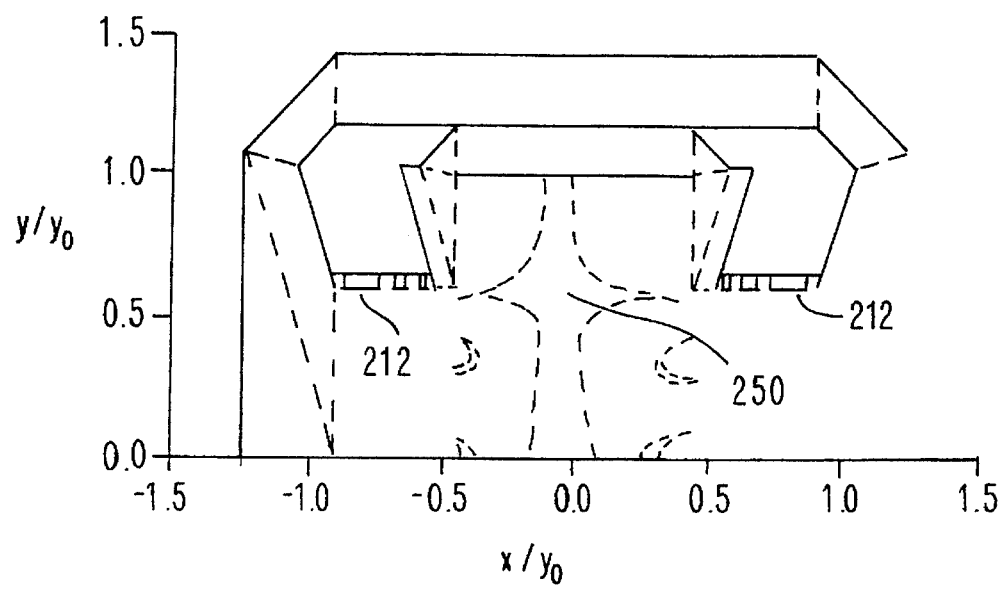
FIGS. 37 and 38 illustrate the effect on the imaging region after the second and third compensation steps, respectively.

After removal of the $\mu=\infty$ membrane, there remains a residual distortion of the central field, as indicated at 250 by the extent of the 50 ppm imaging regions shown in FIG. 37. This may be corrected by small adjustments of the magnetic sandwiches of the filter structure 212 together with slight modifications of the remanences of selected components of magnetic material. Since the needed corrections are small, there is considerable flexibility in choosing which magnetic components to alter.

To calculate the corrections, the potential is expanded as in Eq. (3.2), but with $y_1$ replaced with $y_2$, the distance from the origin to the top of the lateral cavity, and with $\Phi_1$ replaced with $\Phi_2$, the potential at the top of the lateral cavity. Again a number of harmonics can be cancelled equal to the number of degrees of freedom available. Since $y_2 > y_1$, a greater number of harmonics must be cancelled in order to achieve an imaging region comparable to that obtained before removal of the $\mu=\infty$ membrane. As in the first step of the compensation, the computation exploits the linear dependence of the expansion coefficients on the degrees of freedom.

Figure 38:
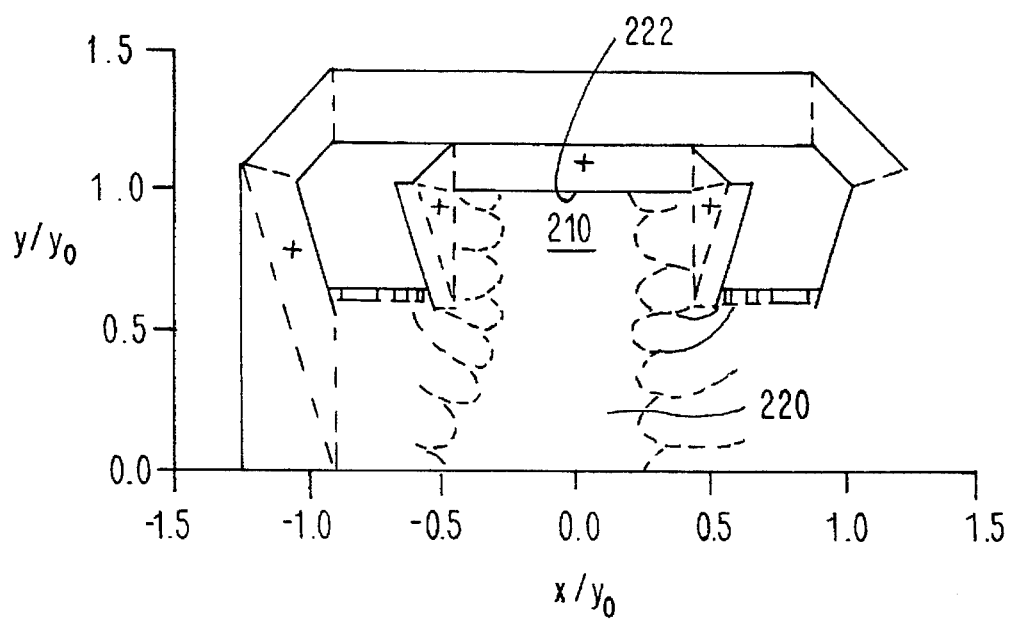

For the example depicted in FIG. 37, the 10 harmonics with $n \leq 5$ can be cancelled by adjusting the 6 magnetic sandwiches of the filter structure 212 and the remanences of 4 components of magnetic material, with the proper adjustments being found by solving a system of 10 linear equations. The 50 ppm imaging region 220 obtained from such a calculation is indicated by FIG. 38. The 4 components of magnetic material that were altered are each marked with a +. Note that the imaging region extends to the top 222 of the lateral cavity 210 and that there is no discernible effect of the corner singularities. Indeed, the final imaging region compares favorably to that with the $\mu=\infty$ membrane still in place (FIG. 34).

We further expound herein on the origin of the field distortions and singularities and describe an alternate solution which uses filter structures both on the pole piece faces as well as on the upper face of the magnet bounding the lateral cavity which avoids the provision of the magnetic insertions.

Figure 40C:
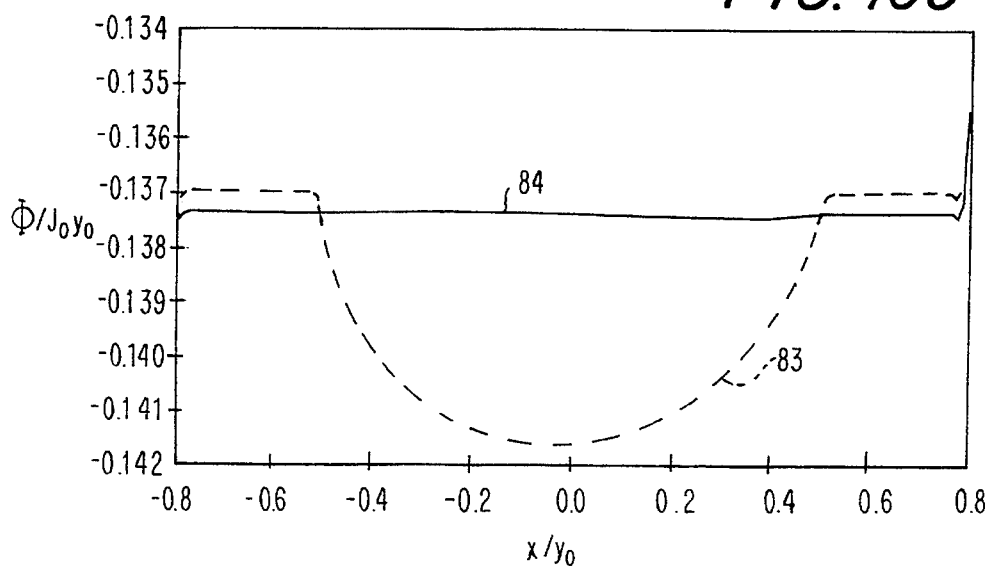

As explained above, when the magnetic structure is opened, singularities are generated at the corners of the inner magnets 73 that lie nearest to the imaging region. At these singularities, $A_1$, $A_2$, the magnetic field diverges. The singularities can be cancelled by changing the remanence of the material in the inner magnet. FIG. 40B is a graph depicting the field that results along the line $A_1-A_2$ and FIG. 40C shows the corresponding magnetostatic potential. The dashed line 80 shows the y-component of the magnetic field in the plane of the corners, in this case $y=y_0/2$, before changing the remanence. The singularities 81 occur at $x=\pm y_0/2$. The solid line 82 shows the field obtained after the singularities are cancelled (K=0.3). The dashed line 83 in FIG. 40C shows the potential at $y=y_0/2$ for the magnet prior to the cancellation of the singularities. The dip corresponds to the opening to the inner magnet. As indicated by the solid line 84, the potential is nearly constant after the singularities are cancelled (K=0.3).

Even after the cancellation of the singularities, a residual non-uniformity remains at the opening to the inner magnet. As shown in FIG. 40A, the dashed line 85 shows the potential for $y=y_0 2$ on an expanded scale. The uniformity can be improved by adding a filter structure to the inner permanent magnet. The solid line 86 shows the potential obtained when the first 3 harmonics are cancelled by the added filter structure.

Figure 39:
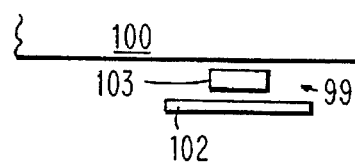
FIGS. 39–41 illustrate filter structures to reduce field non-uniformities.

The filter structure can take several forms as described in the co-pending application. The preferred structure is magnetic filters 99 consisting of permanent magnet blocks between high permeability plates, as illustrated in FIGS. 39 and 40, wherein the two high permeability plates 100, 102, for example, of soft iron, sandwich a magnetic disk 103, for example, of hard ferrite. In the alternate embodiment, the filter structure 99 are preferably located as an inner lining of the soft ferromagnetic blocks 60, 61 and the magnetic plate 62, respectively, as shown in FIG. 41 as primary 105 and secondary 107 filter structures.

Figure 41:
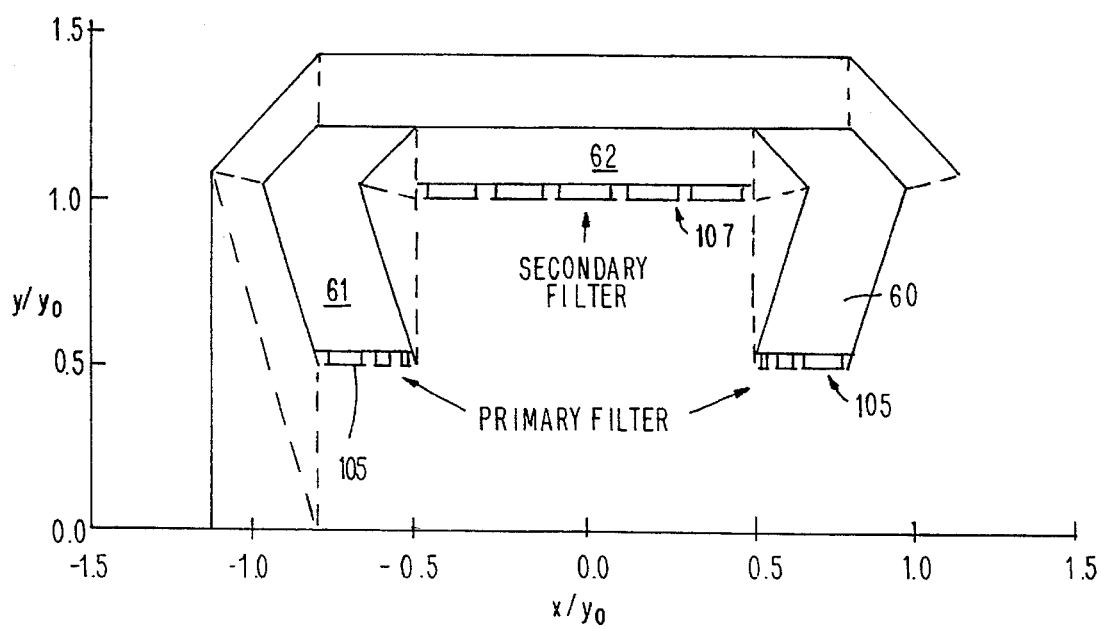

FIG. 41 shows 6 primary elements and 5 secondary elements 107. The potential of the outer plate of each element can be continuously varied by altering the amount of magnetized material contained inside. As will be noted, the elements of the secondary filter 107 are of the same size, but those of the primary filter increase in lateral size in proportion to their distance from the cavity center.

Figure 42:
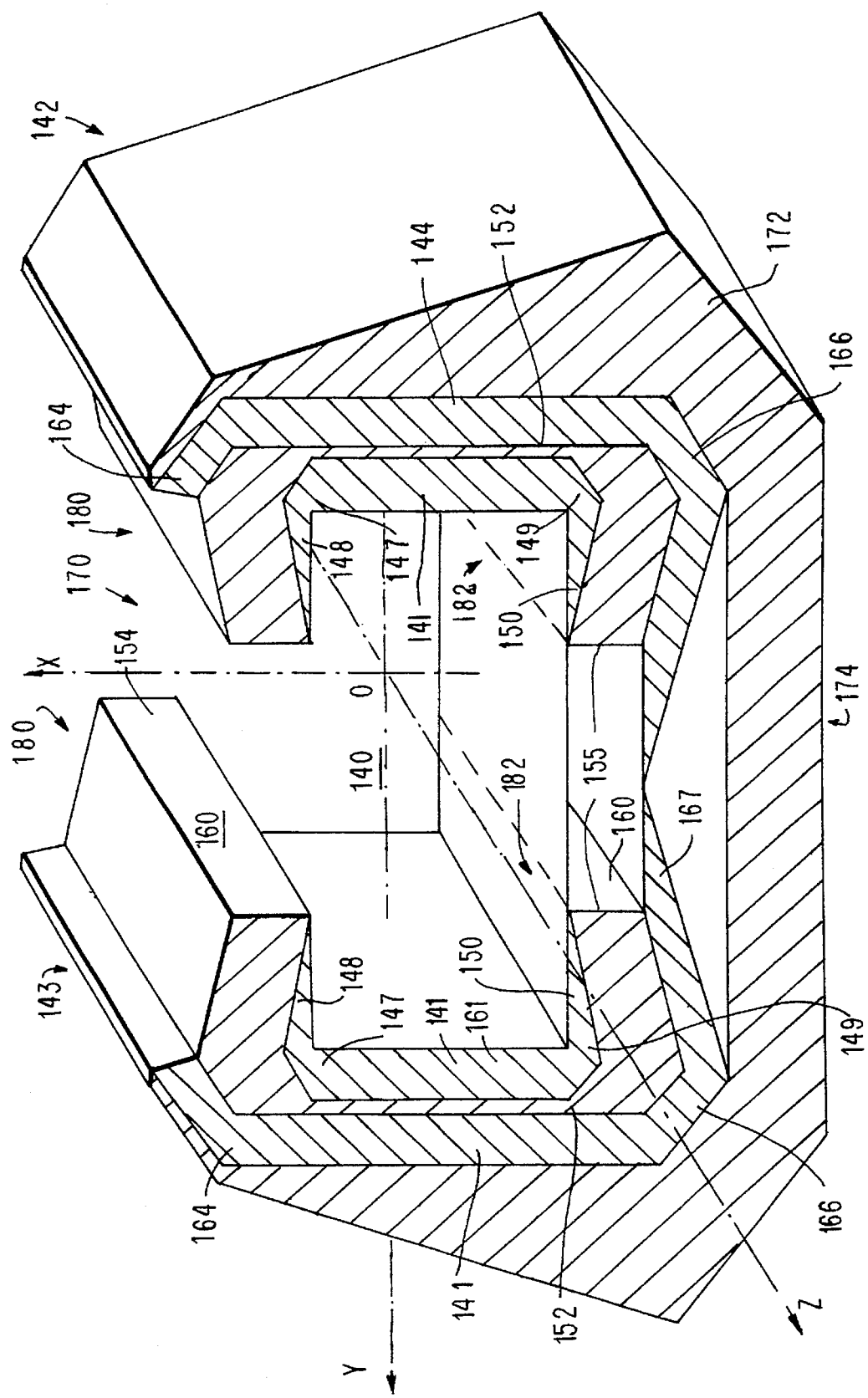
FIG. 42 is an enlarged view of one form of structure according to the invention.
Figure 44:
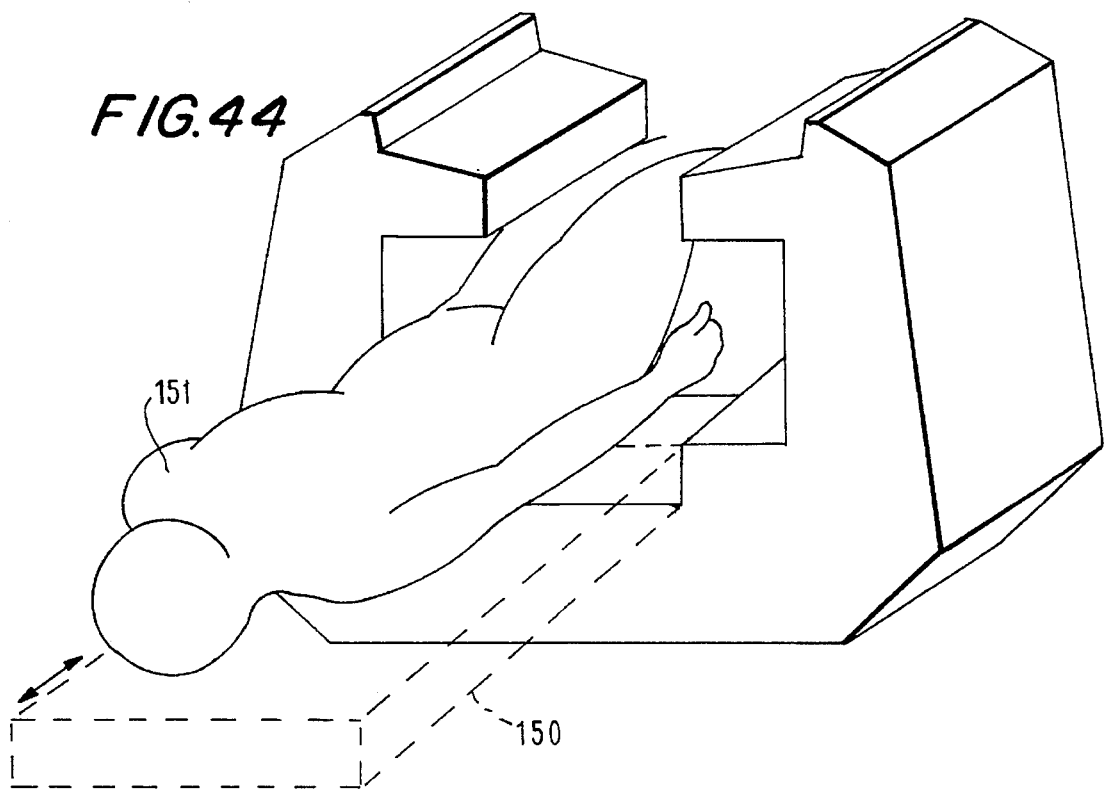
FIG. 44 shows how a body can fit within the cavity of the structure of FIG. 42.

FIG. 42 is a view similar to FIG. 11 in which the individual permanent magnetic blocks 141, 147, 148, 144, 164, 166, 167 and inner 152 and outer 172 soft iron components are also shown. The outer soft iron component 172 or yoke is thick where the flux density is greatest and thin where the flux density decreases. The thin line 142 represents the floor of the cavity 140 and would typically be the top surface of a supporting platform 150 (FIG. 44). A patient 151, shown in phantom, would occupy the cavity 140 lying, usually, on his or her back. The imaging region would be centered very close to the origin of the xyz coordinate system shown. In the cavity 140, the field is oriented in the y direction, as shown by the equipotential lines in the internal region of the magnet as shown in FIG. 29. The structure of FIG. 42 has been developed at two field strength levels, 3,500 Gauss and 5,000 Gauss. A field uniformity better than 50 ppm is achieved in an imaging region of minimum dimension $2r_0=24$ cm. The magnet material is a neodymium-iron-boron alloy with nominal remanence $B_r=12,900$ Gauss and intrinsic coercivity $H_{ci}=14,000$ Oersteds. The weight of magnetic material is 2.5 tons at 3,500 Gauss and 3.5 tons at 5,000 Gauss. The total weight, including the yoke, is 7.5 tons for the 3,500 Gauss field and 11 tons for the 5,000 Gauss field. The stray field is low in spite of the large opening, as shown in FIG. 28 by the lines of equal field magnitude in the x=0 plane.

Figure 43:
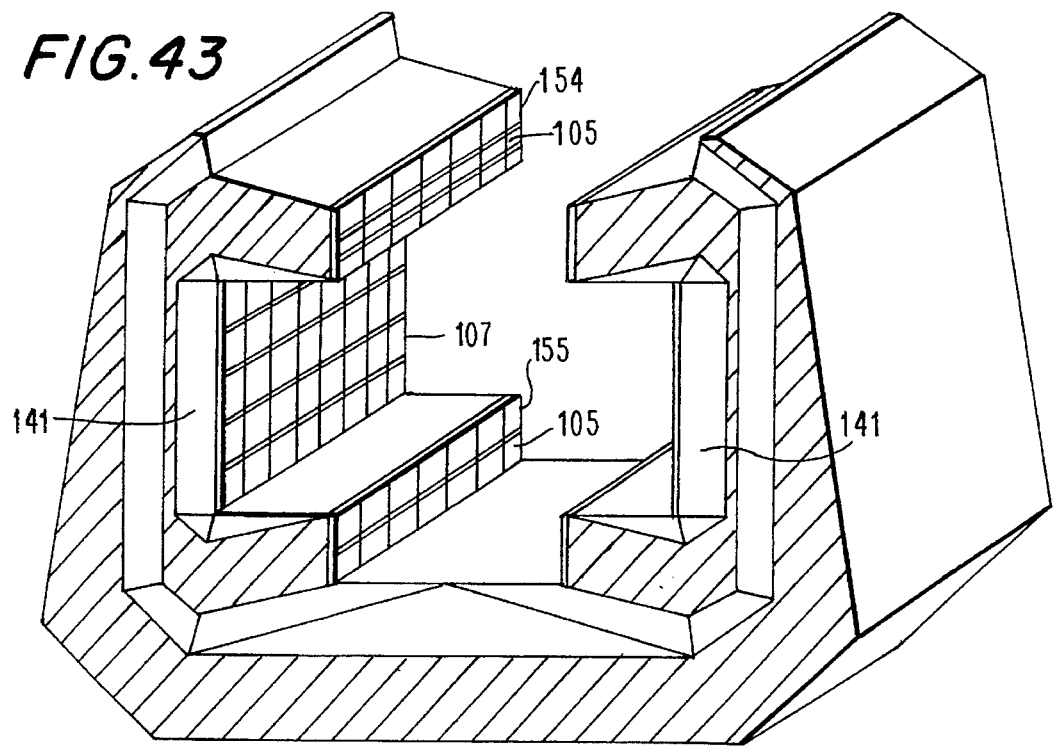
FIG. 43 illustrates the location of the filter structures in an alternate embodiment for the structure of FIG. 42.

In the described embodiment, to achieve the field uniformity described, filter structures 105, 107 were added as shown in FIG. 43 both at the inner sides 154, 155 of the inner ferromagnetic component 160, and at the inner side of the inner permanent magnetic block 141. The details for designing these preferred filter structures can be found not only in the co-pending referenced application and in the description given above, but also in two papers published by us, one in J. Appl. Phys. 76 (10) 15 Nov. 1994, pgs. 6247–6262, and the other entitled "Linear Theory of Pole Piece Design in Permanent Magnets" in the Proc. of the Thirteenth Int. Workshop on Rare Earth magnets and their Applications, Sep. 11–14, 1994, Birmingham, UK, the contents of which are incorporated herein by reference.

While these filter structures are preferred, it will be understood that the invention is not limited to using such structures to compensate for the field distortions described, and other compensating structures can be used in their place.

In essence, the structure of FIG. 42 can be viewed as follows. A general C-shaped structure open-ended along the z-direction defining a generally rectangular main cavity 140 having a width in the y-direction and a height in the x-direction. The rectangular main cavity 140 combines the central cavity 208 (FIG. 31) and the two adjoining lateral cavities 210. A horizontal magnetic field is generated in the y-direction by inner rectangular magnetic blocks 141 extending in the x-direction in both side walls 142, 143, and superimposed outer rectangular magnetic blocks 144 also in both side walls. The inner magnetic blocks 141 each have at top and bottom magnetic blocks whose remanences (magnitude and direction) are such as to produce zero induction externally. In the preferred embodiments, the top and bottom blocks are each formed by triangular sections 147,148 at top and sections 149, 150 at bottom as explained in connection with FIG. 5. Put another way, the shape (angles) and remanence of the triangular sections are chosen such that there is no flux in the triangular sections 147–150. The outer magnetic blocks 144 also of rectangular shape serve to increase the field inside the cavity 140. For this purpose, preferably, the remanence of the inner magnetic sections 141, 147–150 are at most equal to that of the outer magnetic blocks 144. An inner ferromagnetic block 152 with facing pole surfaces 154, 155 separates the superimposed nested magnetic sections 141, 144 and serves as a support for the filter elements (not shown in FIG. 42) and to improve the field homogeneity. The outer rectangular magnetic sections 144 are terminated at top and bottom by magnetic blocks that serve to maintain field uniformity despite the transitions at surfaces 160 and 161 representing magnetic material of different thicknesses spaced different differences from the air gap at the cavity 140, in other words, as a result of the laterally projecting (in the additional magnetic blocks being the y-direction) portions designated 180, 182, which are needed to maintain equipotential lines in the x-direction as illustrated in FIG. 13. In the preferred embodiments, these terminating blocks are trapezoidal magnetic sections 164 at the top and 166 and 167 at the bottom. As explained in connection with FIG. 2, these trapezoidal sections 164,166, 167 have the same magnitude of remanence as that of the rectangular sections 144. The sizes of all of the magnetic blocks are easily determined following the methodology above described once the magnetic material is chosen, preferably of the high energy type described. The dimensioning of the inner ferromagnetic body 152 is determined by the spacing between the facing surfaces 154 which defines the side wall opening 170 and the size of the material needed to carry the flux generated by the magnetic sections. The shape of the outer yoke 172 which surrounds the side walls 142, 143 and forms the bottom wall 174 of the structure is again determined by the flux density carried. Filter structures 104, 105, 112 are provided on the inner surfaces 154, 155 of the ferromagnetic bodies 152 as explained in connection with FIGS. 34 and 41 to compensate for the residual field non-uniformities that remain and in effect tunes the structure to produce equipotential lines as illustrated in FIG. 7, which equipotential lines in the cavity run parallel to the x-z plane. Preferably, as described in connection with FIG. 35, the field compensation includes not only the primary filter structure 212 but also the magnetic insertions 215. Alternatively, as shown in FIG. 41, the field compensation means are filter structures 105 provided on the inner surfaces 154, 155 of the ferromagnetic laterally projecting portions, and filter structures 107 provided on the inner surfaces of both rectangular magnetic sections 141. The filter structures on the opposing surfaces are not visible in FIG. 41 but are the same as that shown on the opposite surface.

The invention can also be viewed as a first independent magnetic structure 141, 164, 166, 167 with pole pieces 160 producing a uniform magnetic field within a central cavity, with a second independent magnetic structure 141, 147, 148, 149, 150 inserted within the pole pieces 160 to provide lateral cavities adjoining opposite sides of the central cavity to provide an overall larger main cavity 140 for receiving a whole human body for NMR imaging. The second independent magnetic structure provides in the lateral cavities the same uniform magnetic field to support the correction of field distortions within the central cavity arising from opening the side wall 170. Rather than following the traditional design of open magnets, in the design approach described in Section 1, the magnet cavity is the combination of individual cavities of independent magnetic structures inserted within the pole pieces of an external structure open to the outside medium. The independent internal structures are not open to the outside medium and are designed to generate a uniform field within their respective cavities. As a consequence, they contribute to the correction of the field distortion within the cavity of the external open structure of the magnet.

This design approach results in the logic of the compensation of the field distortion described in Section 3. The major correction of the distortion is achieved with a filter structure applied to the pole pieces of the external open structure of the magnet, and the higher order correction is achieved by a modification of the design parameters of the magnetic components, including the components of the internal closed structures. An essential part of the higher order correction is the compensation of field singularities associated with any residual field mismatch at the interface between the cavities of the individual magnetic structures as discussed in Sections 2 and 3.

Figure 45A:
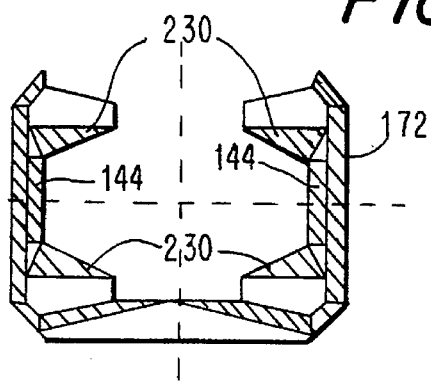
FIGS. 45A–45C are cross-sectional views of modified structures in accordance with the invention.
Figure 45B:
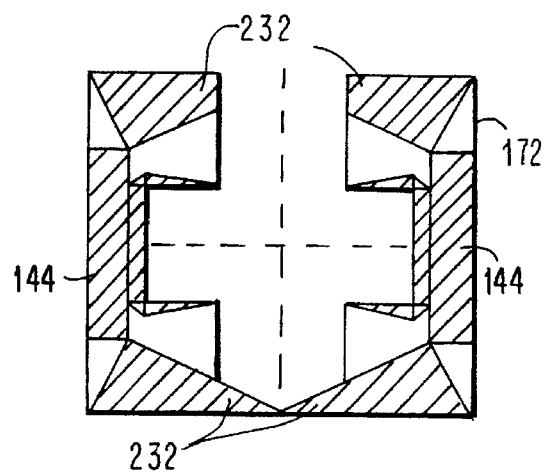
Figure 45C:
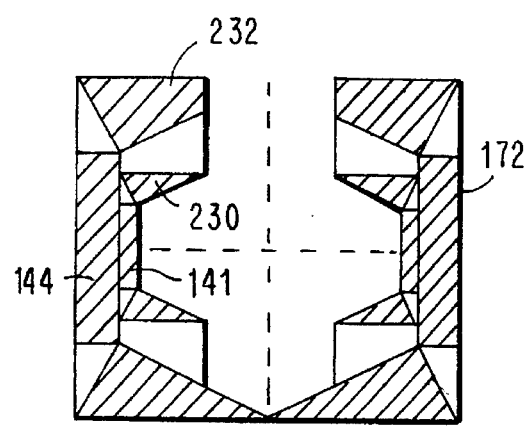

It will be understood that the invention is not limited to the particular shapes and sizes of the components as shown and other configurations obtained by following the design methodology described resulting from a choice of different magnetic parameters and different sized openings are also deemed within the scope of this invention. For example, the FIG. 42 embodiment provides a main rectangular cavity. FIG. 45A illustrates another embodiment that employs different shaped triangular magnets 230 to replace the corresponding inner magnets 147, 148, 149, 150 in the FIG. 42 embodiment and form a hexagonal main cavity. The FIG. 45B embodiment employs trapezoidal magnetic blocks 232 to replace corresponding outer magnets 164, 166, 167 in FIG. 42. The FIG. 45C embodiment combines the inner magnets of FIG. 45A with the outer magnets of FIG. 45B. The yoke 172 is represented in all three figures by the thicker surrounding lines.

The highly uniform field generated in the main cavity of the open magnet presented in this application is the result of the design approach defined in Section 1 and the development of the filter and compensating structures analyzed in Sections 2 and 3.

The magnet presented in this paper appears to be suitable for medical application particularly because of the remarkable proximity of the region of high field uniformity to the opening of the magnet. The large opening of such a compact magnet makes it possible to integrate the gantry of the scanner in a surgical suite with minimum interference with the surgical instrumentation.

To summarize, the permanent magnet design methodology described herein leads to an open prismatic structure (FIG. 2) which minimizes the problems encountered in the traditional design. Access to the patient is achieved through the large opening at the top as well as from the ends of the structure. The rectangular cavity of the magnet is designed for a horizontal position of the patient. In contrast to the field configuration of both a traditional C-magnet and the superconductive open magnet, the maximum intensity of the field and the region of highest uniformity are located in the central region of the rectangular cavity around the center. In one embodiment, the dimensions of the cavity are: height 40 cm, width 80 cm, length 100 cm, and the width of the top opening is 40 cm.

The results show that a magnetic field producing a field strength up to 5,000 Gauss is achieved with practical dimensions of the novel magnet. In particular, unless the upper field limit is dictated by diagnostic requirements, the lower 3,500 Gauss field and a low stray field are achieved with a remarkably compact and moderate weight structure.

While the invention has been described in conjunction with specific embodiments, it will be evident to those skilled in the art that many alternatives, modifications and variations will be apparent in light of the foregoing description. Accordingly, the invention is intended to embrace all such alternatives, modifications and variations as fall within the spirit and scope of the appended claims.

APPENDIX

[1] Abele M. Structures of permanent magnets. John Wiley and Sons, New York, 1993.

[2] Jensen J. H., Abele M. G. Effects of field orientation on field uniformity in permanent magnet structures. J Appl Phys 76(10), 6853–6855, 1994.

[3] Abele M. G., Rusinek H. Field computation in permanent magnets with linear characteristics of magnetic media and ferromagnetic materials. Technical Report 24, New York University, Aug. 15, 1991.

[4] Abele M. G., Jensen J., Rusinek H. Linear Theory of Pole Piece Design in Permanent Magnets. Proceeding of XIII International Workshop on Rare-Earth Magnets and Applications. C. A. F. Manwaring, D. G. R Jones, A. J. Williams and I. R. Harris, Eds, University of Birmingham, Edgbaston, United Kingdom, pp 167–176, 1994.

[5] Abele M. G. Generation of highly uniform fields with permanent magnets. Technical Report No. 26, Department of Radiology, New York University School of Medicine, Jun. 15, 1994.

[6] Abele M. G. Generation of highly uniform fields with permanent magnets (invited paper). J Appl Phys 76(10), 6247–6252, 1994.

What is claimed is:

1. A hybrid magnet structure comprising:

(a) a primary magnetic system comprising a first permanent magnetic structure and spaced opposed first and second ferromagnetic pole pieces on the magnetic structure and defining a main central cavity having at least one end access opening and facing a side access opening in the primary magnetic system, said primary magnetic system generating a substantially uniform magnetic field within a first region of interest of the main cavity, said first region of interest being accessible via the end and side openings, (b) a secondary magnetic structure comprising second and third opposed permanent magnets each inset into one of the first and second ferromagnetic pole pieces, said second and third permanent magnets being configured to define first and second lateral cavities adjoining and between the main central cavity and the second and third permanent magnets, respectively, said secondary magnetic structure generating within second and third regions of interest within the first and second lateral cavities, respectively, substantially the same uniform magnetic field as is generated within the first region of interest within the main central cavity by the primary magnetic system, thereby to provide an enlarged region of interest combining the first, second and third regions of interest and having a substantially uniform magnetic field without substantially increasing the overall size and weight of the resultant hybrid magnetic structure.

2. The hybrid magnetic structure of claim 1, further comprising:

(c) means for compensating for field distortions within the central cavity arising from the side access opening.

3. The hybrid magnetic structure of claim 2, wherein the means for compensating comprises a filter structure applied to the surfaces of the pole pieces facing the central cavity.

4. The hybrid magnetic structure of claim 3, further comprising higher order correction means by compensation of field singularities associated with residual field mismatch at the interfaces between the cavities and the magnetic structures.

5. The hybrid magnetic structure of claim 4, wherein the higher order correction is by means of magnetic insertions in regions between the pole pieces and the secondary magnetic structure.

6. The hybrid magnetic structure of claim 4, wherein the higher order correction is by means of a secondary filter structure applied to the surfaces of the secondary magnetic structure facing the lateral cavities.

7. A hybrid magnetic structure comprising:

(a) spaced side walls and a connecting bottom wall defining an inside cavity of a coordinate system having an origin generally at the center of the cavity and wherein the x-axis extends vertically upward from the bottom wall, the y-axis extends horizontally generally parallel to the bottom wall, and the z-axis extends lengthwise of the cavity generally parallel to the bottom and side walls, (b) each side wall comprising a rectangular-shaped first permanent magnetic block extending parallel to the x-z plane and magnetized in the y-direction with upper and lower second and third permanent magnetic blocks extending in the y-direction and forming with the first permanent magnetic block a magnetic structure wherein the outside surface has substantially zero equipotential and a strong magnetic field is generated within the cavity in the y-direction, (c) each side wall further comprising fourth and fifth soft ferromagnetic blocks extending in the y-direction and positioned outside, respectively, of the second and third permanent magnetic blocks, said fourth ferromagnetic blocks in opposite side walls being spaced from one another defining a generally elongated top opening at the top of the structure and extending in the z-direction, (d) a ferromagnetic yoke surrounding the side and bottom walls of the structure for closing the path of flux generated by the first, second and third permanent magnetic blocks, (e) means to compensate for field distortions within the cavity arising from the top opening in the magnetic structure, (f) said magnetic structure being configured and magnetized to produce in the y-direction within a region of interest centered in the cavity near the origin of the coordinate system a substantially uniform magnetic field.

8. The structure of claim 7, further comprising additional compensating means for residual field-non-uniformities, said additional compensating means being provided on the inside surfaces of the fourth ferromagnetic blocks.

9. The structure of claim 8, where the first permanent magnetic blocks have inner surfaces bounding the cavity, said additional compensating means also being provided on the inner surfaces of the first permanent magnetic blocks.

10. A hybrid magnetic structure comprising:

(a) spaced side walls and a connecting bottom wall defining an inside cavity of a coordinate system having an origin generally at the center of the cavity and wherein the x-axis extends vertically upward from the bottom wall, the y-axis extends horizontally generally parallel to the bottom wall, and the z-axis extends lengthwise of the cavity generally parallel to the bottom and side walls, (b) each side wall comprising a rectangular-shaped first permanent magnetic block extending in the x-direction and magnetized in the y-direction with upper and lower triangular-shaped second and third permanent magnetic blocks extending in the y-direction and forming with the first permanent magnetic block a magnetic structure wherein the outside surface has substantially zero equipotential and a strong magnetic field is generated within the cavity in the y-direction, (c) each side wall further comprising fourth and fifth soft ferromagnetic blocks extending in the y-direction and positioned outside, respectively, of the second and third permanent magnetic blocks, said fourth ferromagnetic blocks in opposite side walls being spaced from one another defining a generally elongated top opening at the top of the structure and extending in the z-direction, said fifth soft ferromagnetic blocks in opposite side walls being spaced from one another adjacent the bottom wall, (d) a ferromagnetic yoke surrounding the side and bottom walls of the structure for closing the path of flux generated by the first, second and third permanent magnetic blocks, (e) means to compensate for field distortions within the cavity arising from the top opening in the magnetic structure, said means to compensate comprising sixth and seventh permanent magnetic blocks located at both side walls and surrounding the first permanent magnetic blocks and magnetized in the same y-direction to produce equipotential field lines that extend in the cavity in the x-direction, (f) said magnetic structure being configured and magnetized to produce in the y-direction within a region of interest centered in the cavity near the origin of the coordinate system a substantially uniform magnetic field.

11. The magnetic structure of claim 10, further comprising eighth and ninth trapezoidal permanent magnetic sections located in the side walls adjoining the top and bottom sides of the sixth and seventh permanent magnetic blocks, respectively.

12. The magnetic structure of claim 11, further comprising additional compensating means for residual field non-uniformities arising from undesirable harmonics of the field.

13. The magnetic structure of claim 12, wherein the additional compensating means comprise first and second filter structures.

14. The magnetic structure of claim 13, wherein the first filter structures are mounted on the facing spaced surfaces of the fourth soft ferromagnetic blocks.

15. The magnetic structure of claim 14, wherein the first filter structures are also mounted on the facing spaced surfaces of the fifth soft ferromagnetic blocks.

16. The magnetic structure of claim 15, wherein the first permanent magnetic blocks have inner surfaces bounding the cavity, and the second filter structures are mounted on the inner surfaces of the first permanent magnetic blocks.

17. A hybrid magnetic structure comprising:

(a) spaced side walls and a connecting bottom wall defining an inside cavity of a coordinate system wherein the x-axis extends vertically upward from the bottom wall, the y-axis extends horizontally generally parallel to the bottom wall, and the z-axis extends lengthwise of the cavity generally parallel to the bottom and side walls, (b) each side wall comprising a rectangular-shaped first permanent magnetic block extending in the x-direction and magnetized in the y-direction with upper and lower triangular-shaped second and third permanent magnetic blocks extending in the y-direction, (c) each side wall further comprising fourth and fifth soft ferromagnetic blocks extending in the y-direction and positioned outside, respectively, of the second and third permanent magnetic blocks, said fourth ferromagnetic blocks in opposite side walls being spaced from one another defining a generally elongated top opening at the top of the structure and extending in the z-direction, (d) a ferromagnetic yoke surrounding the side and bottom walls of the structure, (e) sixth, seventh, and eighth pairs of permanent magnetic blocks located between the first to fifth blocks and the yoke, said sixth blocks being rectangular and being located each behind a first block and magnetized in the same direction as the first blocks, said seventh blocks having a trapezoidal cross-section and located on opposite sides of the top opening, said eighth blocks having a trapezoidal cross-section and located adjacent the bottom wall, (f) said magnetic structure being configured and magnetized to produce in the y-direction within a region of interest of the cavity a substantially uniform magnetic field, (g) said yoke closing the path of flux generated by the first to third and sixth to eighth blocks.

18. The magnetic structure of claim 17, wherein each of the first to third and sixth to eighth blocks have outer surfaces and each being magnetized in a direction perpendicular to its outer surface.

* * * * *